(12) United States Patent
Kim et al.

(10) Patent No.: US 12,356,790 B2
(45) Date of Patent: Jul. 8, 2025

(54) DISPLAY DEVICE AND LIGHT EMITTING DEVICE

(71) Applicant: Samsung Electronics Co., Ltd., Suwon-si (KR)

(72) Inventors: Tae Hyung Kim, Seoul (KR); Heejae Chung, Seoul (KR); Eun Joo Jang, Suwon-si (KR); Sujin Park, Seoul (KR); Yuho Won, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 567 days.

(21) Appl. No.: 17/851,211

(22) Filed: Jun. 28, 2022

(65) Prior Publication Data
US 2022/0416187 A1 Dec. 29, 2022

(30) Foreign Application Priority Data
Jun. 28, 2021 (KR) .......................... 10-2021-0084197

(51) Int. Cl.
*H10K 50/15* (2023.01)
*H10K 50/115* (2023.01)
(Continued)

(52) U.S. Cl.
CPC ......... *H10K 50/115* (2023.02); *H10K 50/125* (2023.02); *H10K 50/15* (2023.02); *H10K 2102/101* (2023.02)

(58) Field of Classification Search
CPC ........... H10K 2102/101; H10K 50/115; H10K 50/125; H10K 50/15
See application file for complete search history.

(56) References Cited

U.S. PATENT DOCUMENTS 6,645,645 B1 11/2003 Adachi et al.
7,700,200 B2 4/2010 Vladimir et al.
(Continued)

FOREIGN PATENT DOCUMENTS

EP 2621599 A1 8/2013
JP 2021027002 A 2/2021
(Continued)

OTHER PUBLICATIONS

B Feigelson et al., "Growth of Bulk GaN Crystals," ScienceDirect, 2011, pp. 232-281, vol. 3.
(Continued)

*Primary Examiner* — Hoa B Trinh
(74) *Attorney, Agent, or Firm* — CANTOR COLBURN LLP

(57) ABSTRACT

An electroluminescent display device and a light emitting device including a blue light emitting layer include a first electrode, a second electrode, and a light emitting layer between the first electrode and the second electrode. The light emitting layer includes a blue light emitting layer including a plurality of nanostructures, the plurality of nanostructures does not include cadmium. On an application of a bias voltage, the blue light emitting layer is configured to emit light of an emission peak wavelength ($\lambda_{max}$) in a range of greater than or equal to about 445 nm and less than or equal to about 480 nm. During a bias voltage change from a first voltage to a second voltage, the second voltage being greater than the first voltage by at least about 5 volts, the emission peak wavelength ($\lambda_{max}$) of the blue light emitting layer may exhibit a first emission peak wavelength (a $1^{st}$ $\lambda_{max}$ wavelength) that is less than an emission peak wavelength at the first voltage ($\lambda_{max}$@first voltage) and an emission peak wavelength at the second voltage ($\lambda_{max}$@second voltage), and during the bias voltage change, (Continued)

a change width in emission peak wavelength ($\lambda_{max}$) is less than or equal to about 4 nm.

20 Claims, 7 Drawing Sheets

(51) Int. Cl.
 *H10K 50/125* (2023.01)
 *H10K 102/10* (2023.01)

(56) References Cited

U.S. PATENT DOCUMENTS

| | | | |
|---|---|---|---|
| 8,120,010 | B2 | 2/2012 | Cho et al. |
| 10,228,584 | B2 | 3/2019 | Kim et al. |
| 2005/0274944 | A1 | 12/2005 | Jang et al. |
| 2008/0290797 | A1 | 11/2008 | Park et al. |
| 2009/0039764 | A1 | 2/2009 | Cho et al. |
| 2012/0032138 | A1 | 2/2012 | Kim et al. |
| 2013/0277669 | A1 | 10/2013 | Krebs et al. |
| 2014/0014896 | A1 | 1/2014 | Chung et al. |
| 2015/0076494 | A1 | 3/2015 | Pickett et al. |
| 2019/0280231 | A1* | 9/2019 | Kim ................... C09K 11/02 |
| 2023/0011887 | A1* | 1/2023 | Zhang ............. H10H 20/8513 |

FOREIGN PATENT DOCUMENTS

| | | |
|---|---|---|
| KR | 20150121355 A | 10/2015 |
| KR | 101734465 B1 | 5/2017 |
| KR | 20180035279 A | 4/2018 |
| KR | 20200010877 A | 1/2020 |
| WO | 2012041847 A1 | 4/2012 |

OTHER PUBLICATIONS

KyoungWon Park et al., "Single Molecule Quantum-Confined Stark Effect Measurements of Semiconductor Nanoparticles at Room Temperature," ACS Nano, Oct. 17, 2012, pp. 10013-10023, vol. 6, No. 11.

Shuo Sun et al., "Strain tuning of a quantum dot strongly coupled to a photonic crystal cavity," Applied Physics Letters, Oct. 7, 2013, pp. 1-4, vol. 103, No. 151102.

Yasuhiro Shirasaki et al., "Origin of Efficiency Roll-Off in Colloidal Quantum-Dot Light-Emitting Diodes," Physical Review Letters, May 21, 2013, pp. 1-5, vol. 110, No. 217403.

* cited by examiner

DISPLAY DEVICE AND LIGHT EMITTING DEVICE

CROSS-REFERENCE TO RELATED APPLICATION

This application claims priority to Korean Patent Application No. 10-2021-0084197 filed in the Korean Intellectual Property Office on Jun. 28, 2021, and all the benefits accruing therefrom under 35 U.S.C. § 119, the contents of which in its entirety is herein incorporated by reference.

BACKGROUND

1. Field

The present disclosure relates to a display device (e.g., an electroluminescent display device) and a light emitting device.

2. Description of the Related Art

Nanostructures such as quantum dots (hereinafter, referred to as quantum dots) are semiconductor materials in the form of particles having a nanoscale size and may exhibit a quantum confinement effect and may exhibit luminescence. Light emission of quantum dots may be generated when electrons in an excited state transit from a conduction band to a valence band, for example, by light excitation or by application of a voltage. Quantum dots may be structured to emit light of a desired wavelength region by controlling their sizes and/or compositions.

An electroluminescent device including nanostructures such as quantum dots may be used in display devices. Light emission may be induced by application of a voltage and resulted from a radiative recombination of excited charges in a light emission layer included in a device.

SUMMARY

An embodiment provides a luminescent (e.g., photo- or electro luminescent) display device for example, that emits light by applying a voltage to nanostructures (e.g., quantum dots).

An embodiment provides a display device (e.g., a QD-LED display) including a nanostructure (e.g., quantum dots) as a light emitting material in a blue pixel and optionally red pixel and/or green pixel.

An embodiment provides a light emitting device including the nanostructure.

In an embodiment, an electroluminescent display device includes a blue pixel, wherein the device includes a first electrode and a second electrode each having a surface opposite the other, i.e., each with a surface, facing the other; and a light emitting layer disposed between the first electrode and the second electrode, the light emitting layer includes a blue light emitting layer disposed in the blue pixel and including a plurality of nanostructures, wherein the plurality of nanostructures does not include cadmium, wherein the blue light emitting layer is configured to exhibit an emission peak wavelength ($\lambda_{max}$) of greater than or equal to about 445 nanometers and less than or equal to about 480 nanometers upon application of a bias voltage between the first electrode and the second electrode, wherein during a bias voltage change from a first voltage to a second voltage, the second voltage being greater than the first voltage by at least about 5 volts, e.g., by about 6 volts, the emission peak wavelength ($\lambda_{max}$) of the blue light emitting layer is configured to exhibit a first (e.g., a lowest) emission peak wavelength (a $1^{st}$ $\lambda_{max}$ wavelength) that is less than an emission peak wavelength at the first voltage ($\lambda_{max}$@first voltage) and an emission peak wavelength at the second voltage ($\lambda_{max}$@second voltage), and during the bias voltage change, a change width in the emission peak wavelength ($\lambda_{max}$) is less than or equal to about 4 nanometers. The change width in the emission peak wavelength may be greater than zero nanometers.

In an embodiment, a difference between the emission peak wavelengths at the first and second voltages (i.e., the difference between the $\lambda_{max}$ @first voltage and the $\lambda_{max}$@second voltage) may be less than or equal to about 4 nm (e.g., about 3 nm, about 2 nm, about 1 nm, or 0 nm).

The first voltage may be about 3 volts and the second voltage may be about 8 volts or about 9 volts. The first voltage may be a voltage at which a given device is configured to exhibit a brightness of from about 10 candela per square meter (cd/m$^2$) to about 250 cd/m$^2$, and/or a current density of from about 0.8 milliampere per square centimeter (mA/cm$^2$) to about 3.5 mA/cm$^2$.

The display device may further include a charge auxiliary layer between the light emitting layer and the first electrode, and/or between the light emitting layer and the second electrode.

The charge auxiliary layer may include a hole auxiliary layer including an organic compound, and/or an electron auxiliary layer including metal oxide nanoparticles.

The plurality of nanostructures may include (e.g., a core comprising) a first semiconductor nanocrystal comprising zinc, selenium, and tellurium and (e.g., a shell disposed on the core and comprising) a second semiconductor nanocrystal comprising zinc chalcogenide and different from the first semiconductor nanocrystal.

An average size of the plurality of nanostructures may be greater than or equal to about 7 nm, greater than or equal to about 8 nm, greater than or equal to about 9 nm, or greater than or equal to about 10 nm.

An average size of the plurality of nanostructures may be less than or equal to about 30 nm, less than or equal to about 20 nm, less than or equal to about 15 nm, less than or equal to about 12 nm, or less than or equal to about 10 nm.

In the plurality of nanostructures (or in the first semiconductor nanocrystal),
- a mole ratio of tellurium to selenium may be less than or equal to about 0.051:1, or less than or equal to about 0.03:1 and greater than or equal to about 0.0021:1, and/or
- a mole ratio of sulfur to selenium may be greater than or equal to about 0.1:1, greater than or equal to about 0.2:1, greater than or equal to about 0.3:1, greater than or equal to about 0.4:1, or greater than or equal to about 0.45:1 and less than or equal to about 1:1, less than or equal to about 0.9:1, less than or equal to about 0.8:1, less than or equal to about 0.7:1, less than or equal to about 0.6:1, or less than or equal to about 0.55:1.

In the plurality of nanostructures (or in the first semiconductor nanocrystal),
- a mole ratio of tellurium to selenium may be less than or equal to about 0.05 and greater than or equal to about 0.001:1, and
- a mole ratio of sulfur to zinc may be greater than or equal to about 0.23:1, greater than or equal to about 0.3:1, or greater than or equal to about 0.35:1 and less than or equal to about 0.40:1.

The plurality of semiconductor nanostructures may include a core including the first semiconductor nanocrystal and a shell disposed on the core and including the second semiconductor nanocrystal.

The blue light emitting layer may have a minimum value of the first emission peak wavelength ($1^{st}\lambda_{max}$) at a voltage of "A" volts, the A volt may be greater than or equal to the first voltage (e.g., greater than about 3 volts) and less than or equal to the second voltage (e.g., less than about 8 volts). The first (lowest) emission peak wavelength ($1^{st}\lambda_{max}$) at the A volt may be less than the $\lambda_{max}$@first voltage and/or the $\lambda_{max}$@second voltage. A difference between the first (lowest) emission peak wavelength ($1^{st}\lambda_{max}$) at the A volt and the $\lambda_{max}$@first voltage (or the $\lambda_{max}$@second voltage) may be greater than or equal to about 1 nm, 2 nm, 3 nm, or 4 nm and less than or equal to about 5 nm.

An emission peak wavelength of the blue light emitting layer upon application of the first bias voltage (e.g., about 3 volts) may be greater than an emission peak wavelength of the blue light emitting layer upon application the second bias voltage (e.g., about 8 volts).

An emission peak wavelength of the blue light emitting layer upon application of the first bias voltage (e.g., about 3 volts) may be less than or equal to an emission peak wavelength of the blue light emitting layer upon application of the second bias voltage (e.g., about 8 volts).

In an embodiment, the emission peak wavelengths at the second bias voltage (the $\lambda_{max}$@second voltage) may be less than or equal to the emission peak wavelengths at the first bias voltage (the $\lambda_{max}$@first voltage).

A full width at half maximum (FWHM) of an emission peak of the blue light emitting layer upon application of the second bias voltage (e.g., about 8 volts) to the blue light emitting layer may be less than a full width at half maximum of an emission peak of the blue light emitting layer upon application of the first bias voltage (e.g., about 3 volts). A difference between the full width at half maximum of the emission peak at the second voltage and the full width at half maximum of the emission peak at the first voltage may be greater than or equal to about 1 nanometer and less than or equal to about 10 nm.

A change width in the emission peak wavelength (Amax) (or a difference between the greatest emission peak wavelength (Amax) and the smallest emission peak wavelength (Amax) during the voltage change between the first voltage and the second voltage) may be greater than or equal to about 1 nm (e.g., greater than or equal to about 2 nm, greater than or equal to about 3 nm, and less than or equal to about 5 nm, or less than or equal to about 4 nm).

The display device may further include a red pixel, a green pixel, or a red pixel and a green pixel.

The light emitting layer may further include a red light emitting layer disposed in the red pixel and including a plurality of red light emitting nanostructures, and/or a green light emitting layer disposed in the green pixel and including a plurality of green light emitting nanostructures.

In an embodiment, a light emitting device includes an anode and a cathode being spaced (e.g., each having a surface opposite the other); and a blue light emitting layer disposed between the anode and the cathode and including a plurality of nanostructures, the plurality of nanostructures is as described herein and when a bias voltage is applied between the anode and the cathode, an emission peak wavelength ($\lambda_{max}$) of the blue light emitting layer is in the range of greater than or equal to about 445 nm and less than or equal to about 480 nm, wherein as a bias voltage is changed from a first voltage to a second voltage, the second voltage being greater than the first voltage by at least about 5 volts, e.g., by about 6 volts, the emission peak wavelength ($\lambda_{max}$) of the blue light emitting layer is configured to exhibit a first (e.g. a lowest) emission peak wavelength (a $1^{st}$ $\lambda_{max}$ wavelength) that is less than an emission peak wavelength at the first voltage 0 and an emission peak wavelength at the second voltage ($\lambda_{max}$ @second voltage), and during the bias voltage change from the first voltage to the second voltage, a change width or a change breadth of the emission peak wavelength ($\lambda_{max}$) is less than or equal to about 4 nm. The first voltage may be about 3 volts and the second voltage may be about 8 volts or about 9 volts.

The light emitting device may further include a hole auxiliary layer between the light emitting layer and the anode.

The light emitting device may further include an electron auxiliary layer between the light emitting layer and the cathode.

The hole auxiliary layer may include a hole transport layer including an organic polymer compound.

The electron auxiliary layer may include zinc magnesium metal oxide nanoparticles.

The plurality of nanostructures may include a core including a first semiconductor nanocrystal comprising zinc, selenium, and tellurium and a semiconductor nanocrystal shell disposed on the core and including a zinc chalcogenide having a composition different from that of the first semiconductor nanocrystal.

An emission peak wavelength of the blue light emitting layer upon application of the first bias voltage (e.g., about 3 volts) may be greater than an emission peak wavelength of the blue light emitting layer upon application of the second bias voltage (e.g., about 8 volts). An emission peak wavelength of the blue light emitting layer upon application of the first bias voltage (e.g., about 3 volts) may be less than an emission peak wavelength of the blue light emitting layer upon application of the second bias voltage (e.g., about 8 volts).

An emission peak wavelength of the blue light emitting layer upon application of the first bias voltage (e.g., about 3 volts) may be equal to or different from an emission peak wavelength of the blue light emitting layer upon application of the second bias voltage (e.g., about 8 volts).

A full width at half maximum of an emission peak upon application of the second bias voltage (e.g., about 8 volts) may be less than a full width at half maximum of an emission peak upon application of the first bias voltage (e.g., about 3 volts).

The change width in the emission peak wavelength ($\lambda_{max}$) may be greater than zero nm, greater than or equal to 1 nm, greater than or equal to 2 nm, or greater than or equal to 3 nm. The change width in the emission peak wavelength ($\lambda_{max}$) may be less than or equal to about 5 nm, less than or equal to about 4 nm, less than or equal to about 3 nm, less than or equal to about 2 nm, or 1 less than or equal to about 3 nm.

A difference between the first and the second emission peak wavelengths (between the $\lambda_{max}$@first voltage and the $\lambda_{max}$@second voltage) may be greater than or equal to about 1 nm.

The light emitting device may have a T90 of greater than or equal to about 1 hour.

The light emitting device may have a maximum brightness of greater than or equal to about 30,000 cd/m².

In an embodiment, an electroluminescent device (or light emitting device) includes a first electrode and a second electrode; and a light emitting layer disposed between the first electrode and the second electrode, the light emitting layer includes a blue light emitting layer disposed in the blue pixel and including a plurality of nanostructures, wherein the plurality of nanostructures does not include cadmium, wherein the blue light emitting layer is configured to exhibit an emission peak wavelength ($\lambda_{max}$) of greater than or equal to about 445 nanometers and less than or equal to about 480 nanometers upon application of a bias voltage between the first electrode and the second electrode, wherein as a bias voltage is changed from a first voltage to a second voltage, the second voltage being greater than the first voltage by at least about 5 volts, e.g., by about 6 volts, a difference between an emission peak wavelength ($\lambda_{max}$) at the first voltage (a $\lambda_{max}$@first voltage) and an emission peak wavelength ($\lambda_{max}$) at the second voltage (a $\lambda_{max}$@second voltage) is greater than or equal to zero nanometers, greater than or equal to about 1 nm and less than about 4 nanometers (e.g., less than or equal to about 3 nm or less than or equal to about 2 nm).

According to embodiments, a display device having an improved display quality may be realized by suppressing a change in a peak wavelength in accordance with a change of a driving voltage. The light emitting device according to embodiments may exhibit improved life-span and improved optical properties (e.g., brightness).

DETAILED DESCRIPTION

Figure 1:
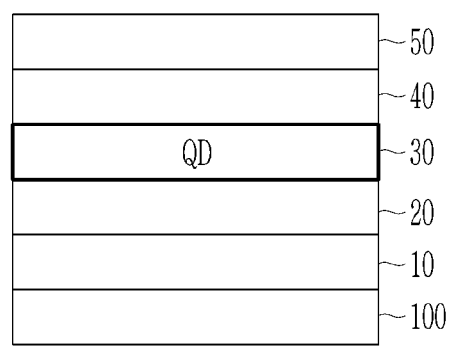
FIG. 1 is a schematic cross-sectional view of a display device according to an embodiment.

Hereinafter, with reference to the accompanying drawings, various embodiments of the present disclosure will be described in detail so that those of ordinary skill in the art can easily carry out the present disclosure. The present disclosure may be embodied in many different forms and is not limited to the embodiments described herein. In order to clearly explain the present disclosure, parts irrelevant to the description are omitted, and the same reference numerals are assigned to the same or similar elements throughout the specification.

The size and thickness of each constituent element as shown in the drawings are randomly indicated for better understanding and ease of description, and this disclosure is not necessarily limited to as shown. In the drawings, the thickness of layers, films, panels, regions, etc., are exaggerated for clarity. And in the drawings, for convenience of description, the thickness of some layers and regions are exaggerated. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

In addition, it will be understood that when an element such as a layer, film, region, or substrate is referred to as being "on" another element, it can be directly on the other element or intervening elements may also be present. In contrast, when an element is referred to as being "directly on" another element, there are no intervening elements present. Also, to be disposed "on" the reference portion means to be disposed above or below the reference portion and does not necessarily mean "above".

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as being limited to "a" or "an." "or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or ±5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Further, in the entire specification, the term "planar view" means a case in which a target part is viewed from the top, and the term "cross-sectional view" means a case in which a cross-section of the target part that is cut in a vertical direction is viewed from the side.

As used herein, when a definition is not otherwise provided, "substituted" refers to replacement of at least one hydrogen of a compound or the corresponding moiety by a substituent selected from a C1 to C30 alkyl group, a C1 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—ON), an amino group (—NRR' wherein R and R' are each independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—O(=O)OR, wherein R is a C1 to C6 alkyl group or a C6 to C12 aryl group), a carboxyl group (—OOOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), and a combination thereof.

Herein, the description that does not comprise cadmium (or other toxic heavy metal) may refer to a concentration of cadmium (or a corresponding heavy metal) of less than or equal to about 100 ppm, less than or equal to about 50 ppm, less than or equal to about 10 ppm, or almost zero. In an embodiment, substantially no cadmium (or other toxic heavy metal) is present, or, if present, in an amount or impurity level below the detection limit of a given detection means.

Herein, quantum dots refer to luminescent nanostructures (e.g., capable of emitting light by energy excitation) including (e.g., semiconductor-based) nanocrystals exhibiting quantum confinement or exciton confinement. Herein, the term "quantum dot" is not limited in its shape unless otherwise defined. Herein, the nanostructure refers to a structure having at least one region of a nanoscale dimension or at least one characteristic dimension of nanoscale. In an embodiment, the dimensions of the nanostructure maybe be less than about 300 nm, less than about 250 nm, less than about 150 nm, less than about 100 nm, less than about 50 nm, or less than about 30 nm. These structures may have any shape. Unless otherwise specified herein, the nanostructures or quantum dots may have any shape, such as nanowires, nanorods, nanotubes, multi-pod type shapes having two or more pods, nanodots (or quantum dots), etc., but are not particularly limited. The nanostructures may be, for example, substantially crystalline, substantially monocrystalline, polycrystalline, amorphous, or a combination thereof.

A luminescent nanostructure such as a quantum dot may have a size smaller than a Bohr excitation diameter in a bulk crystal material having an identical composition and may exhibit a quantum confinement effect. The luminescent nanostructure may emit light corresponding to its bandgap energy by controlling a size of a nanocrystal acting as an emission center thereof.

The bandgap energy of the luminescent nanostructure may vary with a size and a composition of the nanostructure. For example, as the sizes of quantum dots increase, the quantum dots may have narrow energy bandgaps and increased emission wavelengths. A semiconductor nanocrystal has drawn attention as light emitting materials in various fields of a display device, an energy device, or a bio light emitting device. The luminescent nanostructures including the semiconductor nanocrystal and exhibiting an electroluminescent property of a practically applicable level may contain a harmful heavy metal such as cadmium (Cd), lead, mercury, or a combination thereof. Accordingly, it is desirable to provide a light emitting device or a display device having a light emitting layer substantially free of the harmful heavy metal(s).

A display device according to an embodiment includes an electroluminescent luminescent type light emitting device configured to emit a desired light by applying a voltage in the absence of a separate light source.

In an embodiment, an electroluminescent display device includes a blue pixel, wherein the device includes a first electrode and a second electrode each having a surface opposite the other, i.e., each with a surface facing each other; and a light emitting layer disposed between the first electrode and the second electrode and not containing cadmium. The first electrode may include an anode, and the second electrode may include a cathode. Alternatively, the first electrode may include a cathode and the second electrode may include an anode. In the electroluminescent display device, the first electrode or the second electrode may be disposed on a (transparent) substrate. The transparent substrate may be a light extraction surface. (Refer to FIGS. 1 and 2) The light emitting layer includes a blue light emitting layer disposed in the blue pixel and including a plurality of nanostructures.

In an embodiment, a light emitting device includes a first electrode (e.g., anode) and a second electrode (e.g., cathode) being spaced (e.g., facing) each other; and a blue light emitting layer disposed between the first electrode and the second electrode and including a plurality of nanostructures, wherein when a bias voltage is applied between the first electrode and the second electrode, an emission peak wavelength ($\lambda_{max}$) of the blue light emitting layer is in a range of greater than or equal to about 445 nanometers (nm) and less than or equal to about 480 nm. As the bias voltage changes from a first voltage (e.g., about 3 volts) to a second voltage (e.g., about 8 volts or about 9 volts), the emission peak wavelength ($\lambda_{max}$) of the blue light emitting layer may be configured to exhibit a first (e.g., a lowest) emission peak wavelength ($1^{st}\ \lambda_{max}$) that is less than an emission peak wavelength at the first voltage ($\lambda_{max}$ @first voltage), and an emission peak wavelength at the second voltage ($\lambda_{max}$ @second voltage). During the bias voltage change from the first voltage to the second voltage, a change width in the emission peak wavelength ($\lambda_{max}$) is less than or equal to about 4 nanometers. The change width in the emission peak wavelength may be greater than zero nanometers. In an embodiment, a difference between the emission peak wavelengths at the first and second voltages (i.e., the difference between the $\lambda_{max}$ @first voltage and the $\lambda_{max}$ @second voltage) may be less than or equal to about 4 nm, less than or equal to about 3 nm, less than or equal to about 2 nm, or less than or equal to about 1 nm. The difference between the emission peak wavelengths at the first and second voltages may be greater than or equal to 0 nm, greater than or equal about 1 nm, greater than or equal about 2 nm, or greater than or equal about 3 nm.

The electroluminescent display device may further include a red pixel, a green pixel, or a red and a green pixel(s). The light emitting layer may further include a red light emitting layer disposed in the red pixel and including a plurality of red light emitting nanostructures, and/or a green light emitting layer disposed in the green pixel and including a plurality of green light emitting nanostructures.

Figure 2:
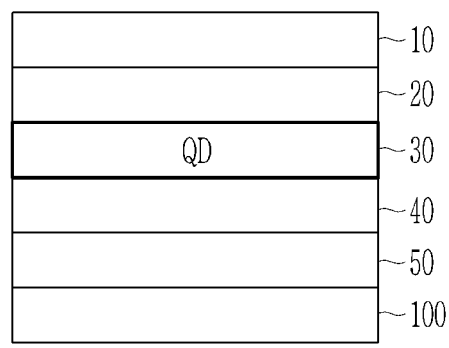
FIG. 2 is a schematic cross-sectional view of a display device according to another embodiment.

Referring to FIGS. 1 and 2, a light emitting layer 30 may be disposed between a first electrode (e.g., an anode) 10 and a second electrode (e.g., a cathode) 50. The cathode 50 may include an electron injection conductor. The anode 10 may include a hole injection conductor. The work functions of the electron/hole injection conductors included in the cathode and the anode may be appropriately adjusted and are not particularly limited. For example, the cathode may have a small work function and the anode may have a relatively large work function, or vice versa.

The electron/hole injection conductors may include a metal-based material (e.g., a metal, a metal compound, an alloy, or a combination thereof) (e.g., aluminum, magnesium, tungsten, nickel, cobalt, platinum, palladium, calcium, LiF, etc.), a metal oxide such as gallium indium oxide or indium tin oxide (ITO), or a conductive polymer (e.g., having a relatively high work function) such as polyethylene dioxythiophene, but are not limited thereto.

At least one of the first electrode and the second electrode may be a light-transmitting electrode or a transparent electrode. In an embodiment, both the first electrode and the second electrode may be a light-transmitting electrode. The electrode(s) may be patterned. The first electrode and/or the second electrode may be disposed on a (e.g., insulating) substrate. The substrate may be optically transparent (e.g., may have a light transmittance of greater than or equal to about 50%, greater than or equal to about 60%, greater than or equal to about 70%, greater than or equal to about 80%, greater than or equal to about 85%, or greater than or equal to about 90% and for example, less than or equal to about 99%, or less than or equal to about 95%). The substrate may include a region for a blue pixel. The substrate may further include a region for a red pixel, and/or a region for a green pixel. A thin film transistor may be disposed in each region of the substrate, and one of a source electrode and a drain electrode of the thin film transistor may be electrically connected to the first electrode or the second electrode.

The light-transmitting electrode may be disposed on a (e.g., insulating) transparent substrate. The substrate may be a rigid or a flexible substrate. The substrate may include a plastic or organic material such as a polymer, an inorganic material such as a glass, or a metal.

The light-transmitting electrode may be made of, for example, a transparent conductor such as indium tin oxide (ITO) or indium zinc oxide (IZO), gallium indium tin oxide, zinc indium tin oxide, titanium nitride, polyaniline, LiF/Mg: Ag, or the like, or a thin metal thin film of a single layer or a plurality of layers, but is not limited thereto. If one of the first electrode and the second electrode is an opaque electrode, it may be made of an opaque conductor such as aluminum (Al), a lithium-aluminum (Li:Al) alloy, a magnesium-silver (Mg;Ag) alloy, and lithium fluoride-aluminum (LiF:Al).

The thickness of the electrode (the first electrode and/or the second electrode) is not particularly limited and may be appropriately selected in consideration of device efficiency. For example, the thickness of the electrode may be greater than or equal to about 5 nm, for example, greater than or equal to about 10 nm, greater than or equal to about 20 nm, greater than or equal to about 30 nm, greater than or equal to about 40 nm, or greater than or equal to about 50 nm. For example, the thickness of the electrode may be less than or equal to about 100 micrometers (μm), for example, less than or equal to about 90 μm, less than or equal to about 80 μm, less than or equal to about 70 μm, less than or equal to about 60 μm, less than or equal to about 50 μm, less than or equal to about 40 μm, less than or equal to about 30 μm, less than or equal to about 20 μm, less than or equal to about 10 μm, less than or equal to about 1 μm, less than or equal to about 900 nm, less than or equal to about 500 nm, or less than or equal to about 100 nm.

The light emitting layer 30 disposed between the first electrode and the second electrode (e.g., the anode 10 and the cathode 50) may include a plurality of nanostructures (e.g., blue light emitting nanostructures, and optionally red light emitting nanostructures, and/or green light emitting nanostructures). The plurality of nanostructures may not comprise cadmium. The light emitting layer may include one or more (e.g., 2 or more or 3 or more and 10 or less) monolayers of a plurality of nanostructures. The plurality of nanostructures may include quantum dots having a core-shell structure.

Figure 3:
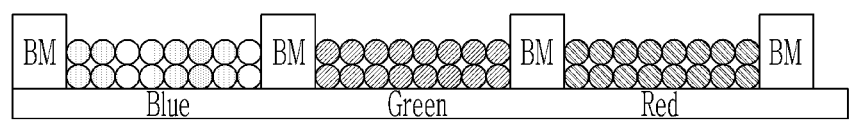
FIG. 3 is a schematic cross-sectional view of a light emitting layer included in a display device according to an embodiment.

The light emitting layer may be patterned. In an embodiment, the patterned light emitting layer may include a blue light emitting layer disposed in the blue pixel. In an embodiment, the light emitting layer may further include a red light emitting layer disposed in the red pixel, a green light emitting layer disposed in the green pixel, or a red light emitting layer disposed in the red pixel and a green light emitting layer disposed in the green pixel. Each of the (e.g., red, green, or blue) light emitting layers may be (e.g., optically) separated from an adjacent light emitting layer by a partition wall. In an embodiment, partition walls such as black matrices (BM) may be disposed between the red light emitting layer(s), the green light emitting layer(s), and the blue light emitting layer(s). See, FIG. 3. The red light emitting layer, the green light emitting layer, and the blue light emitting layer may be optically isolated from each other.

In the display device or light emitting device according to an embodiment, the blue light emitting layer may be configured to show an emission peak wavelength ($\lambda_{max}$) that is in a range of greater than or equal to about 440 nm and less than or equal to about 480 nm, upon application of a bias voltage between the first electrode and the second electrode. In an embodiment, the emission peak wavelength (λmax) may be greater than or equal to about 440 nm, greater than or equal to about 445 nm, greater than or equal to about 450 nm, or greater than or equal to about 451 nm, and less than or equal to about 480 nm, less than or equal to about 470 nm, less than or equal to about 465 nm, less than or equal to about 460 nm, less than or equal to about 458 nm, or less than or equal to about 455 nm.

In the (display or light emitting) device according to an embodiment, as the voltage bias is changed from a first voltage to a second voltage, the emission peak wavelength (λmax) of the blue light emitting layer may exhibit a first (e.g., a lowest) emission peak wavelength (a $1^{st} \lambda_{max}$) that is less than an emission peak wavelength at the first voltage ($\lambda_{max}$ @first voltage) and an emission peak wavelength at the second voltage ($\lambda_{max}$ @second voltage) and as the voltage of the bias is changed from the first voltage to the second voltage, a change width in the emission peak wavelength ($\lambda_{max}$) may be less than or equal to about 4 nanometers. The change width in the emission peak wavelength may be greater than zero nanometers. The change width in the emission peak wavelength may be greater than or equal to about 1 nm, greater than or equal to about 1.5 nm, greater than or equal to about 2 nm, greater than or equal to about 2.5 nm, or greater than or equal to about 3 nm. The change width in the emission peak wavelength may be less than or equal to about 3.5 nm, less than or equal to about 3 nm, less than or equal to about 2.5 nm, or less than or equal to about 2 nm.

The change width in the emission peak wavelength may be greater than a difference between the emission peak wavelength at the first voltage ($\lambda_{max}$ @first voltage) and the emission peak wavelength at the second voltage ($\lambda_{max}$ @second voltage).

The first voltage may be a voltage at which a given device is configured to exhibit a brightness of from about 10 candela per square meter ($cd/m^2$) to about 250 $cd/m^2$, and/or a current of from about 0.8 milliampere per square centimeter ($mA/cm^2$) to about 3.5 $mA/cm^2$. In an embodiment, the first voltage may be from about 2.6 volts to about 5 volts, from about 3 volts to 4 volts, or a combination thereof. The second voltage may be greater than the first voltage. A difference between the first voltage and the second voltage may be greater than or equal to about 5 volts, greater than or equal to about 6 volts and less than or equal to about 8 volts, less than or equal to about 7 volts, less than or equal to about 6.4 volts, less than or equal to about 6 volts, or less than or equal to about 5 volts. In an embodiment, the emission peak wavelength of the blue light emission layer is slightly blue-shifted (e.g., changes toward a shorter wavelength) at a relatively low bias voltage range (e.g., from about 2.4 volts to about 4 volts) and the emission peak wavelength of the blue light emission layer is slightly red-shifted (e.g., changes toward a longer wavelength) at a relatively high bias voltage range (e.g., from about 5 volts and to about 8 volts or 9 volts).

In the display device or light emitting device according to an embodiment, a full width at half maximum of an emission peak at the second voltage may be less than a full width at half maximum of an emission peak at the first voltage. A difference between the full width at half maximum of the first voltage and the full width at half maximum of the second voltage may be greater than or equal to about 1 nm, for example, in a range of about 1 nm to about 10 nm, about 2 nm to about 9 nm, about 3 nm to about 7 nm, about 4 nm to about 6 nm, or about 4.5 nm to about 5 nm, or a range defined by any two of the wavelength values above.

In the display device or light emitting device of an embodiment, a brightness at the first voltage may be in the range of greater than or equal to about 10 $cd/m^2$, greater than or equal to about 30 $cd/m^2$, greater than or equal to about 50 $cd/m^2$, greater than or equal to about 70 $cd/m^2$, greater than or equal to about 90 $cd/m^2$, greater than or equal to about 110 $cd/m^2$, greater than or equal to about 130 $cd/m^2$, greater than or equal to about 150 $cd/m^2$, greater than or equal to about 170 $cd/m^2$, greater than or equal to about 190 $cd/m^2$, or greater than or equal to about 210 $cd/m^2$, and less than or equal to about 250 $cd/m^2$, less than or equal to about 200 $cd/m^2$, less than or equal to about 150 $cd/m^2$, less than or equal to about 100 $cd/m^2$, or less than or equal to about 50 $cd/m^2$.

In the display device or light emitting device of an embodiment, a current density at the first voltage may be greater than or equal to about 0.8 $mA/cm^2$, greater than or equal to about 1 $mA/cm^2$, greater than or equal to about 1.5 $mA/cm^2$, greater than or equal to about 2 $mA/cm^2$, or greater than or equal to about 2.5 $mA/cm^2$, and less than or equal to about 3.5 $mA/cm^2$, less than or equal to about 3 $mA/cm^2$, less than or equal to about 2.5 $mA/cm^2$, less than or equal to about 2 $mA/cm^2$, or less than or equal to about 1.5 $mA/cm^2$.

In the display device or light emitting device of an embodiment, a brightness at a voltage of about 3 volts or about 4 volts may be greater than or equal to about 230 $cd/m^2$, greater than or equal to about 300 $cd/m^2$, greater than or equal to about 350 $cd/m^2$, greater than or equal to about 400 $cd/m^2$, greater than or equal to about 500 $cd/m^2$, greater than or equal to about 600 $cd/m^2$, greater than or equal to about 700 $cd/m^2$, greater than or equal to about 800 $cd/m^2$, greater than or equal to about 900 $cd/m^2$, greater than or equal to about 1000 $cd/m^2$, greater than or equal to about 1500 $cd/m^2$, greater than or equal to about 2000 $cd/m^2$, greater than or equal to about 3000 $cd/m^2$, greater than or equal to about 4000 $cd/m^2$, greater than or equal to about 5000 $cd/m^2$, greater than or equal to about 6000 $cd/m^2$, greater than or equal to about 7000 $cd/m^2$, greater than or equal to about 8000 $cd/m^2$. greater than or equal to about 10000 $cd/m^2$, greater than or equal to about 15000 $cd/m^2$, greater than or equal to about 20000 $cd/m^2$. In the device of an embodiment, the brightness at about 3 volts or 4 volts may be less than or equal to about 25000 $cd/m^2$, less than or equal to about 20000 $cd/m^2$, less than or equal to about 18000 $cd/m^2$, less than or equal to about 12000 $cd/m^2$, less than or equal to about 9000 $cd/m^2$, less than or equal to about 5000 $cd/m^2$, or less than or equal to about 1000 $cd/m^2$.

In the device of an embodiment, a current density a voltage of at about 3 volts or 4 volts may be greater than or equal to about 3.5 $mA/cm^2$, greater than or equal to about 10 $mA/cm^2$, greater than or equal to about 15 $mA/cm^2$, greater than or equal to about 25 $mA/cm^2$, greater than or equal to about 50 $mA/cm^2$, greater than or equal to about 80 $mA/cm^2$, greater than or equal to about 100 $mA/cm^2$, greater than or equal to about 120 $mA/cm^2$, greater than or equal to about 140 $mA/cm^2$, or greater than or equal to about 160 $mA/cm^2$. In the device of an embodiment, the current density at 3 volts or 4 volts may be less than or equal to about 1000 $mA/cm^2$, less than or equal to about 500 $mA/cm^2$, less than or equal to about 100 $mA/cm^2$, less than or equal to about 50 $mA/cm^2$, less than or equal to about 10 $mA/cm^2$, less than or equal to about 3.5 $mA/cm^2$.

A light emitting device including nanostructures exhibiting a quantum confinement effect or a display device including the same may show a different emission wavelength depending on the applied bias voltage. In such a light emitting device or a display device, nanostructures may exhibit an increasing wavelength as the bias voltage is increased. Due to a wavelength change by an electric field, as an increased voltage is applied to the light emitting device or the display device, an emission wavelength may shift toward a longer wavelength (red-shift), which may cause an unwanted color change in accordance with a driving voltage.

In case of the display device of an embodiment, the wavelength change may be suppressed or limited (or controlled within a desired range), and thereby, exhibiting an improved display quality. In addition, by suppressing or limiting such a wavelength change, the light emitting device of an embodiment may exhibit improved brightness and/or an increased life-span.

The display device and the light emitting device of an embodiment may exhibit a blue shift in an emission wavelength as a voltage applied to the blue light emitting layer is increased for example, within a predetermined range (e.g., from about 2.6 volts to about 4 volts). In an embodiment, the blue light emitting layer may have a lowest value of the first emission peak wavelength (i.e., the $1^{st}$ $\lambda_{max}$) at volt A, the voltage A may be greater than about 3 volts, greater than or equal to about 3.5 volts, greater than or equal to about 4 volts, greater than or equal to about 4.5 volts, or greater than or equal to about 5 volts. The voltage A may be in the range of less than about 10 volts, for example, less than or equal to about 9 volts, less than or equal to about 8 volts, less than or equal to about 7.5 volts, less than or equal to about 7 volts, or less than or equal to about 6.5 volts.

In an embodiment, an emission peak wavelength of the blue light emitting layer when the bias of the first voltage (e.g., of about 3 volts) is applied may be the same as an emission peak wavelength of the blue light emitting layer when the bias of the second voltage (e.g., of about 8 volts) is applied. In an embodiment, an emission peak wavelength of the blue light emitting layer when the bias of the first voltage (e.g., about 3 volts) is applied may be different from the emission peak wavelength of the blue light emitting layer when the bias of the second voltage (e.g., about 8 volts) is applied. In an embodiment the former may be greater than the latter. In an embodiment, the former may be less than the latter. In an embodiment, a difference between the former and the latter may be less than or equal to about 4 nm, less than or equal to about 3 nm, less than or equal to about 2 nm, or less than or equal to about 1 nm. In an embodiment, a difference between the former and the latter may range from about 0 nm to about 4 nm, about 0.5 nm to about 3.5 nm, about 1 nm to about 3 nm, about 1.5 nm to about 2.5 nm, about 2 nm to about 3 nm, or a combination thereof.

In an embodiment, the emission peak wavelength when the bias of first voltage (about 3 volts) or the second voltage (e.g. about 8 volts) is applied to the blue light emitting layer may be greater than or equal to about 445 nm, greater than or equal to about 446 nm, greater than or equal to about 447 nm, greater than or equal to about 448 nm, greater than or equal to about 449 nm, greater than or equal to about 450 nm, greater than or equal to about 451 nm, greater than or equal to about 452 nm, greater than or equal to about 453 nm, greater than or equal to about 454 nm, greater than or equal to about 455 nm, greater than or equal to about 456 nm, greater than or equal to about 457 nm, greater than or equal to about 458 nm, greater than or equal to about 459 nm, greater than or equal to about 460 nm, greater than or equal to about 461 nm, or greater than or equal to about 462 nm. In an embodiment, the emission peak wavelength of the blue light emitting layer when the bias of the first voltage (e.g., about 3 volts) or the second voltage (e.g. about 8 volts) is applied may be less than or equal to about 475 nm, less than or equal to about 470 nm, less than or equal to about 465 nm, or less than or equal to about 460 nm.

A full width at half maximum of an emission peak upon application of the second voltage (e.g., about 8 volts) to the blue light emitting layer may be less than a full width at half maximum of an emission peak upon application of the first voltage (e.g., about 3 volts) to the blue light emitting layer.

The full width at half maximum of the second emission peak when the bias of the second voltage (e.g., about 8 volts) is applied to the blue light emitting layer may be in the range of about 5 nm to about 50 nm, about 15 nm to about 45 nm, about 10 nm to about 40 nm, about 15 nm to about 35 nm, about 20 nm to about 30 nm, about 25 nm to about 27 nm, or a range defined by any two of the wavelength values above.

The full width at half maximum of the first emission peak when the bias of the first voltage (e.g., about 3 volts) is applied to the blue light emitting layer may be about 6 nm to about 60 nm, about 15 nm to about 55 nm, about 10 nm to about 50 nm, about 15 nm to about 45 nm, about 20 nm to about 40 nm, about 25 nm to about 38 nm, about 27 nm to about 35 nm, or a range defined by any two of the wavelength values above.

A difference between the full width at half maximum of the emission peak upon application of the second voltage (e.g., about 8 volts) and the full width at half maximum of the emission peak upon application of the first voltage (e.g., about 3 volts) may be in the range of about 1 nm to about 10 nm, about 2 nm to about 9 nm, about 3 nm to about 7 nm, about 4 nm to about 6 nm, about 4.5 nm to about 5 nm, or a range defined by any two of the wavelength values above.

In the display device or light emitting device of an embodiment, a change in the emission peak wavelength (Δmax) during the change of the bias voltage may be from 0 nm to about 4 nm, about 0.5 nm to about 4 nm, about 1 nm to about 3 nm, about 1.5 nm to about 2.5 nm, or a range defined by any two of the wavelength values above.

The present inventors have found that, in the light emitting device or the display device according to an embodiment, as current is increased to a predetermined voltage in the blue light emitting layer, the emission wavelength may exhibit a blue shift (for example, see, FIG. 4A), so that the wavelength change depending on a voltage change may be controlled within a predetermined range, and an optical property (e.g., brightness) and a life-span of the device may be improved.

Without wishing to be bound by any particular theory, in the light emitting device or display device of an embodiment, the luminescent nanostructures disposed in the blue light emitting layer may have an appropriate level of a hole localized state formed between a balance band and a conduction band, and at high flux photoluminescent (PL) excitation and high voltage electroluminescence (EL) wherein the number of excitons increases (e.g., up to a predetermined voltage, for example, like the voltage, A), a decay time difference between the hole localized sate and a band edge state may occur and a blue shift may be exhibited. In other words, it is believed that at a high flux excitation, a velocity of a charge coming down or relaxing to a balance band may be greater than a velocity of a charge coming down or relaxing to a hole localized state, and accordingly, the device may exhibit a blue shift phenomenon wherein the emission wavelength is lowered (e.g., shifted to a higher energy).

Without wishing to be bound by any theory, It is believed that by having the blue shift feature of the emission wavelength, the device of an embodiment may exhibit a relatively suppressed level of a red shift phenomenon of an emission wavelength thereof for example as a relatively high voltage is applied thereto. In an embodiment, the device of an embodiment may exhibit a narrower full width at half maximum as a relatively higher voltage is applied thereto.

The device of an embodiment may exhibit a relatively wide full width at half maximum in a photoluminescence spectroscopic analysis but may emit light of a relatively narrow full width at half maximum when a voltage is applied to the device. In an embodiment, as tellurium is doped in a blue QD core, a full width at half maximum may increase in a photoluminescent state, and the increased full width at half maximum may appear at a relatively low voltage region of about 3 V in the EL device. However, the FWHM may decrease as the applied voltage increases, thereby, increasing color purity of the EL device.

The blue light emitting nanostructures may include a zinc chalcogenide (for example, including tellurium). In the blue light emitting nanostructures, a content of tellurium may be less than that of selenium, sulfur, or less than a sum of selenium and sulfur. The zinc chalcogenide may include a zinc selenide (e.g., a tellurium doped zinc selenide).

The blue light emitting nanostructures may include a first semiconductor nanocrystal (e.g., a core) comprising zinc, tellurium, and selenium, and a second semiconductor nanocrystal (e.g., a shell) disposed on the first semiconductor nanocrystal (e.g., the core) and having a composition different from that of the first semiconductor nanocrystal.

The core or the first semiconductor nanocrystal material may include a relatively small or limited amount of tellurium (Te). The core or the nanostructure may include $ZnSe_{1-x}Te_x$, wherein x is greater than 0 and less than or equal to about 0.3. In the core or the nanostructure, an amount of tellurium per 1 mole of selenium may be greater than or equal to about 0.001 mole, greater than or equal to about 0.002 mole, greater than or equal to about 0.003 mole, greater than or equal to about 0.004 mole, greater than or equal to about 0.005 mole, greater than or equal to about 0.006 mole, greater than or equal to about 0.007 mole, greater than or equal to about 0.008 mole, greater than or equal to about 0.009 mole, greater than or equal to about 0.01 mole, greater than or equal to about 0.013 mole, greater than or equal to about 0.015 mole, greater than or equal to about 0.017 mole, greater than or equal to about 0.02 mole, greater than or equal to about 0.025 mole, greater than or equal to about 0.03 mole, greater than or equal to about 0.035 mole, greater than or equal to about 0.04 mole, greater than or equal to about 0.045 mole, or greater than or equal to about 0.05 mole. In the core or the nanostructure, the amount of tellurium relative to 1 mole of selenium may be less than or equal to about 0.25 mole, less than or equal to about 0.2 mole, less than or equal to about 0.15 mole, less than or equal to about 0.1 mole, less than or equal to about 0.09 mole, less than or equal to about 0.06 mole, less than or equal to about 0.053 mole, for example, less than or equal to about 0.05 mole, less than or equal to about 0.049 mole, less than or equal to about 0.048 mole, less than or equal to about 0.047 mole, less than or equal to about 0.046 mole, less than or equal to about 0.045 mole, less than or equal to about 0.044 mole, less than or equal to about 0.043 mole, less than or equal to about 0.042 mole, less than or equal to about 0.041 mole, less than or equal to about 0.04 mole, less than or equal to about 0.035 mole, or less than or equal to about 0.033 mole. The shell may include zinc (Zn), and, selenium (Se) and/or sulfur (S). The shell may be a multilayer shell. The multilayer shell may include a first layer disposed directly on the core and an outer layer (e.g., an outermost layer) disposed on the first layer, wherein the first layer includes ZnSe, ZnSeS, or a combination thereof. The outer layer or the outermost layer may include ZnS. The shell may be a gradient alloy, in which a sulfur content may have a concentration gradient that increases (or decreases) in a direction away from the core.

In the blue light emitting nanostructures, for example, as measured by inductively coupled plasma atomic emission spectroscopy (ICP-AES), a mole ratio (Te:Se) of tellurium to selenium may be less than or equal to about 0.1:1, less than or equal to about 0.06:1, less than or equal to about 0.05:1, less than or equal to about 0.04:1, less than or equal to about 0.03:1, less than or equal to about 0.02:1, less than or equal to about 0.01:1, less than or equal to about 0.009:1, less than or equal to about 0.0089:1, less than or equal to about 0.0085:1, less than or equal to about 0.008:1, less than or equal to about 0.007:1, less than or equal to about 0.006:1, or less than or equal to about 0.005:1. In the blue light emitting nanostructures, the mole ratio of tellurium to selenium may be greater than or equal to about 0.0001:1, greater than or equal to about 0.0005:1, greater than or equal to about 0.0009:1, greater than or equal to about 0.001:1, greater than or equal to about 0.002:1, greater than or equal to about 0.0025:1, greater than or equal to about 0.003:1, greater than or equal to about 0.0035:1, greater than or equal to about 0.004:1, or greater than or equal to about 0.005:1. The mole ratio of tellurium to selenium may be about 0.004:1 to about 0.025:1. In the blue light emitting nanostructures, the zinc content may be greater than the selenium content. In the blue light emitting nanostructure(s) particles (e.g., as confirmed by ICP-AES analysis), the zinc (Zn) content may be greater than the selenium (Se) content, and the selenium content may be greater than the tellurium content.

In an embodiment, the Te:Se mole ratio may be about 0.004:1.

For example, in the blue light emitting nanostructure(s) as confirmed by ICP-AES analysis, a mole ratio of Se to Zn (Se:Zn) may be less than about 1:1, for example, less than or equal to about 0.95:1, less than or equal to about 0.90:1, less than or equal to about 0.85:1, less than or equal to about 0.8:1, less than or equal to about 0.7:1, less than or equal to about 0.6:1, less than or equal to about 0.5:1, or less than or equal to about 0.4:1. The mole ratio of Se to Zn may be greater than or equal to about 0.05:1, for example, greater than or equal to about 0.1:1, greater than or equal to about 0.2:1, greater than or equal to about 0.25:1, greater than or equal to about 0.3:1, greater than or equal to about 0.35:1, greater than or equal to about 0.4:1, greater than or equal to about 0.45:1, greater than or equal to about 0.47:1, greater than or equal to about 0.5:1, or greater than or equal to about 0.55:1. In an embodiment, the Se:Zn mole ratio may be about 0.47:1 or about 0.51:1.

For example, as confirmed by ICP-AES analysis, in the blue light emitting nanostructure(s), a mole ratio of Te to Zn (Te:Zn) may be less than or equal to about 0.03:1, for example, less than or equal to about 0.027:1, less than or equal to about 0.025:1, less than or equal to about 0.02:1, less than or equal to about 0.019:1, less than or equal to about 0.018:1, less than or equal to about 0.017:1, less than or equal to about 0.016:1, less than or equal to about 0.015:1, less than or equal to about 0.01:1, less than or equal to about 0.009:1, less than or equal to about 0.008:1, less than or equal to about 0.007:1, less than or equal to about 0.006:1, or less than or equal to about 0.005:1. The mole ratio of Te to Zn may be greater than or equal to about 0.0005:1, greater than or equal to about 0.0009:1, greater than or equal to about 0.001:1, greater than or equal to about 0.002:1, greater than or equal to about 0.003:1, greater than or equal to about 0.005:1, or greater than or equal to about 0.009:1. In the blue light emitting nanostructure(s) particles according to an embodiment, the amount of tellurium may be less than or equal to about 1 wt % based on the total weight of the semiconductor nanocrystal particles. The blue light emitting nanostructure(s) particles may not comprise cadmium, lead, or a combination thereof. The (blue light emitting semiconductor) nanocrystal particles may not include copper, manganese, or a combination thereof.

In the blue light emitting nanostructure(s), a mole ratio (S:Zn) of sulfur to Zn may be greater than or equal to about 0.1:1, for example, greater than or equal to about 0.15:1, greater than or equal to about 0.2:1, greater than or equal to about 0.3:1, greater than or equal to about 0.31:1, or greater than or equal to about 0.32:1. In the blue light emitting nanostructure(s), the mole ratio of sulfur to Zn may be less than or equal to about 0.9:1, for example, less than or equal to about 0.8:1, less than or equal to about 0.7:1, less than or equal to about 0.6:1, less than or equal to about 0.55:1, less than or equal to about 0.53:1, less than or equal to about 0.52:1, less than or equal to about 0.51:1, less than or equal to about 0.5:1, less than or equal to about 0.49:1, less than or equal to about 0.48:1, less than or equal to about 0.47:1, less than or equal to about 0.46:1, less than or equal to about 0.45:1, less than or equal to about 0.44:1, less than or equal to about 0.43:1, less than or equal to about 0.42:1, less than or equal to about 0.41:1, less than or equal to about 0.39:1, less than or equal to about 0.38:1, or less than or equal to about 0.37:1. In an embodiment, the S:Zn mole ratio may be about 0.36:1 or about 0.35:1.

A mole ratio of a sum of (Se+S) to zinc in the blue light emitting nanostructure(s) may be greater than or equal to about 0.3:1, greater than or equal to about 0.4:1, or greater than or equal to about 0.5:1. In the semiconductor nanocrystal particles, the mole ratio of a sum of (Se+S) to zinc ((Se+S):Zn) may be less than or equal to about 1:1, for example less than about 1:1, and greater than or equal to about 0.5:1, for example, greater than or equal to about 0.6:1, greater than or equal to about 0.7:1, or greater than or equal to about 0.8:1.

A mole ratio (S:Se) of sulfur to selenium in the blue light emitting nanostructure(s) may be greater than or equal to about 0.5:1, greater than or equal to about 0.51:1, greater than or equal to about 0.55:1, greater than or equal to about 0.6:1, greater than or equal to about 0.65:1, greater than or equal to about 0.7:1, or greater than or equal to about 0.75:1. The mole ratio of sulfur to selenium in the blue light emitting nanostructure(s) may be less than or equal to about 2:1, less than or equal to about 1.5:1, less than or equal to about 1:1, less than or equal to about 0.9:1, less than or equal to about 0.85:1, less than or equal to about 0.82:1, or less than or equal to about 0.8:1. In an embodiment, the S:Se mole ratio may be about 0.77:1 or about 0.7:1.

The shape(s) of the blue light emitting nanostructure(s) is not particularly limited. The shape of the nanostructure may include a sphere, a polygon, a multi-pod, or a combination thereof. In an embodiment, the blue light emitting nanostructure(s) may have a multi-pod shape. The multi-pod may have two or more (e.g., three or more or four or more) branch portions and a valley portion therebetween.

In the blue light emitting nanostructure(s), the average size of the core may be greater than or equal to about 2 nm, greater than or equal to about 3 nm, or greater than or equal to about 4 nm. The average size of the core may be less than or equal to about 6 nm, for example, less than or equal to about 5 nm. The size (or average size, hereinafter referred to as size) of the blue light emitting nanostructure(s) may be greater than or equal to about 3 nm, for example, greater than or equal to about 4 nm, greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, or greater than or equal to about 12 nm. The (average) size of the blue light emitting nanostructure(s) may be less than or equal to about 50 nm, for example, less than or equal to about 40 nm, less than or equal to about 35 nm, less than or equal to about 29 nm, less than or equal to about 28 nm, less than or equal to about 27 nm, less than or equal to about 26 nm, less than or equal to about 25 nm, less than or equal to about 24 nm, less than or equal to about 23 nm, less than or equal to about 22 nm, less than or equal to about 21 nm, less than or equal to about 20 nm, less than or equal to about 19 nm, less than or equal to about 18 nm, less than or equal to about 17 nm, less than or equal to about 16 nm, less than or equal to about 15 nm, less than or equal to about 14 nm, less than or equal to about 13 nm, less than or equal to about 12 nm, less than or equal to about 11 nm, or less than or equal to about 10.5 nm. In an embodiment, the (average) size measured by a transmission electronic microscope (TEM) analysis of the nanostructures may be about 10.5 nm or about 9.9 nm.

In the present disclosure, the (average) size of the quantum dot(s) may refer to an equivalent diameter calculated from a two-dimensional image confirmed by an electron microscope. In the present disclosure, the size of the quantum dot(s) may also be confirmed from the composition identified by inductively coupled plasma atomic emission analysis or the like.

The blue light emitting nanostructure(s) according to an embodiment may exhibit a (photoluminescence or electroluminescence) emission peak wavelength of greater than or equal to about 430 nm (e.g., greater than or equal to about 435 nm, greater than or equal to about 440 nm, greater than or equal to about 446 nm, greater than or equal to about 449 nm, or greater than or equal to about 450 nm) and less than or equal to about 480 nm (e.g., less than or equal to about 470 nm, less than or equal to about 465 nm, less than or equal to about 460 nm, or less than or equal to about 455 nm).

The maximum emission peak of the blue light emitting nanostructure(s) may have a full width at half maximum of less than or equal to about 50 nm, for example, less than or equal to about 49 nm, less than or equal to about 48 nm, less than or equal to about 47 nm, less than or equal to about 46 nm, less than or equal to about 45 nm, less than or equal to about 44 nm, less than or equal to about 43 nm, less than or equal to about 42 nm, less than or equal to about 41 nm, less than or equal to about 40 nm, less than or equal to about 39 nm, less than or equal to about 38 nm, less than or equal to about 37 nm, less than or equal to about 36 nm, less than or equal to about 35 nm, less than or equal to about 34 nm, less than or equal to about 33 nm, less than or equal to about 32 nm, less than or equal to about 31 nm, less than or equal to about 30 nm, less than or equal to about 29 nm, or less than or equal to about 28 nm. The emission peak of the blue light emitting nanostructure(s) may have a FWHM of greater than or equal to about 12 nm, greater than or equal to about 20 nm, greater than or equal to about 25 nm, greater than or equal to about 26 nm, greater than or equal to about 30 nm, or greater than or equal to about 35 nm.

The blue light emitting nanostructure(s) may have a quantum efficiency (or a quantum yield) of greater than or equal to about 60%, for example, greater than or equal to about 61%, greater than or equal to about 62%, greater than or equal to about 63%, greater than or equal to about 64%, greater than or equal to about 65%, greater than or equal to about 66%, greater than or equal to about 67%, greater than or equal to about 68%, greater than or equal to about 69%, greater than or equal to about 70%, or greater than or equal to about 71%. The blue light emitting nanostructure(s) may exhibit a quantum efficiency of greater than or equal to about 80%, greater than or equal to about 90%, greater than or equal to about 95%, greater than or equal to about 99%, or greater than or equal to about 100%.

The display device may further include a green pixel, a red pixel, or a combination thereof (e.g., a green pixel and a red pixel). The light emitting layer may further include a green light emitting layer disposed in the green pixel and including a plurality of green light emitting nanostructures, and/or a red light emitting layer disposed in the red pixel and including a plurality of red light emitting nanostructures.

The green light emitting layer may include, for example, a plurality of green light emitting nanostructures capable of emitting green light by applying a voltage. The red light emitting layer may include, for example, a plurality of red light emitting nanostructures capable of emitting red light by applying a voltage.

The green pixel or green light emitting nanostructures may have an emission peak wavelength (e.g., electroluminescence (EL) peak wavelength) of greater than or equal to about 524 nm, or greater than or equal to about 525 nm and less than or equal to about 560 nm, less than or equal to about 550 nm, less than or equal to about 545 nm, or less than or equal to about 536 nm (e.g. about 526 nm to about 545 nm, or about 527 nanometers (nm) to about 535 nm). The green pixel or green light emitting nanostructures may have an emission peak wavelength (e.g., electroluminescence (EL) peak wavelength) of greater than or equal to about 520 nm, greater than or equal to about 524 nm, and greater than or equal to about 535 nm.

The red pixel or red light emitting nanostructures may exhibit an emission peak wavelength (e.g., electroluminescence (EL) peak wavelength) in the range of greater than or equal to about 600 nm, for example, greater than or equal to about 615 nm, greater than or equal to about 625 nm, greater than or equal to about 628 nm and less than or equal to about 650 nm, less than or equal to about 640 nm, or less than or equal to about 635 nm, or less than or equal to about 630 nm. The green pixel or green light emitting nanostructures may exhibit an emission peak wavelength (e.g., electroluminescence (EL) peak wavelength) in the range of about 500 nm to about 550 nm, about 510 nm to about 540 nm, about 525 nm to about 536 nm (e.g., about 526 nm to about 535 nm or about 527 nm to about 534 nm).

The green light emitting nanostructures may include a Group III-V compound including indium, phosphorus, and optionally, zinc, zinc selenide telluride, zinc telluride, or a combination thereof. In an embodiment, the green light emitting nanostructures (e.g., configured to emit the green light) may include a semiconductor nanocrystal core and a semiconductor nanocrystal shell disposed on the core and including a Group II-VI compound. The semiconductor nanocrystal core may include indium phosphide, indium zinc phosphide, or a combination thereof. In another embodiment, the semiconductor nanocrystal core may include ZnTeSe.

In an embodiment, the green light emitting nanostructures include zinc, selenium, and tellurium, and in the green light emitting nanostructures, a mole ratio of tellurium to selenium may be greater than or equal to about 0.1:1, greater than or equal to about 0.15:1, greater than or equal to about 0.2:1, or greater than or equal to about 0.3:1 and less than or equal to about 0.9:1, less than or equal to about 0.7:1, less than or equal to about 0.6:1, or less than or equal to about 0.5:1.

In the green light emitting layer, the green light emitting nanostructure(s) or second quantum dot(s) may include a Group III-V compound including indium, phosphorus and optionally, zinc, zinc selenide telluride, zinc telluride, or a combination thereof.

In an embodiment, the green light emitting nanostructure (s) or second quantum dot(s) may include a semiconductor nanocrystal core including the Group III-V compound, a zinc selenium telluride ($ZnTe_ySe_{1-y}$) (wherein y is greater than or equal to about 0.3, greater than or equal to about 0.4, greater than or equal to about 0.5, or greater than or equal to about 0.6 and less than or equal to about 0.9, less than or equal to about 0.8, or less than or equal to about 0.7), or a combination thereof, and a semiconductor nanocrystal shell disposed on the semiconductor nanocrystal core and having a different composition from that of the semiconductor nanocrystal core. The semiconductor nanocrystalline shell may include a zinc chalcogenide (a zinc selenide and/or a zinc sulfide, or a combination thereof, for example, a zinc selenide sulfide).

The group III-V compound may include indium (In), phosphorus (P), and optionally zinc (Zn). The core may include InP or InZnP. The core may include zinc selenium telluride ($ZnTe_ySe_{1-y}$).

The shell or the zinc chalcogenide may include zinc, and a chalcogen element (e.g., sulfur, selenium, or a combination thereof). The shell may be a multilayer shell in which adjacent layers have different compositions. The shell or the zinc chalcogenide may include ZnSe, ZnS, ZnSeS, or a combination thereof. The thickness of the shell in the green light emitting nanostructure(s) or the second quantum dot(s) may be greater than or equal to about 1 nm, greater than or equal to about 1.5 nm, greater than or equal to about 2 nm, or greater than or equal to about 2.5 nm, and less than or equal to about 5 nm, less than or equal to about 4 nm, less than or equal to about 3 nm, less than or equal to about 2 nm, or less than or equal to about 1.5 nm. The shell may have a composition that varies in a radial direction (for example, outward from the core). In an embodiment, the shell may include a ZnSeS, and an amount of sulfur may increase (or decrease) along a radial direction (for example, outward from the core). In an embodiment, an outermost layer of the shell may include a ZnS or be composed (or consist) of a ZnS. In an embodiment, an inner layer thereof may include a ZnSe or be made of a ZnSeS.

The green light emitting nanostructure(s) (semiconductor nanocrystal particles) may exhibit a quantum efficiency of greater than or equal to about 80%, for example, greater than or equal to about 85%.

The shape of the green light emitting nanostructure(s) is not particularly limited, and may include a sphere, a polyhedron, a multi-pod, or a combination thereof. The (average) size of the green light emitting nanostructure(s) may be greater than or equal to about 3 nm, greater than or equal to about 4 nm, greater than or equal to about 5 nm, greater than or equal to about 5.5 nm, greater than or equal to about 6 nm, greater than or equal to about 6.5 nm, greater than or equal to about 7 nm, greater than or equal to about 7.5 nm, or greater than or equal to about 8 nm, and less than or equal to about 50 nm, less than or equal to about 40 nm, less than or equal to about 35 nm, less than or equal to about 30 nm, less than or equal to about 25 nm, less than or equal to about 20 nm, less than or equal to about 15 nm, less than or equal to about 10 nm, less than or equal to about 9 nm, less than or equal to about 8 nm, less than or equal to about 7 nm, less than or equal to about 6 nm, or less than or equal to about 5.5 nm.

In an embodiment, the green light emitting nanostructures may include zinc, selenium, and tellurium, and in the green light emitting nanostructures, a mole ratio (Te:Se) of tellurium to selenium may be greater than or equal to about 0.1:1, greater than or equal to about 0.15:1, greater than or equal to about 0.2:1, greater than or equal to about 0.25:1, greater than or equal to about 0.3:1, greater than or equal to about 0.35:1, greater than or equal to about 0.4:1, greater than or equal to about 0.45:1, or greater than or equal to about 0.5:1. In the green light emitting nanostructures, the mole ratio (Te/Se) of tellurium to selenium may be less than or equal to about 4:1, less than or equal to about 3.5:1, less than or equal to about 3:1, less than or equal to about 2.5:1, less than or equal to about 2:1, less than or equal to about 1.5:1, or less than or equal to about 1:1.

The green light emitting nanostructures may not include manganese, copper, or a combination thereof. The green light emitting nanostructures may include sulfur and selenium, wherein a mole ratio (S:Se) of sulfur to selenium may be greater than zero, for example, greater than or equal to about 0.5:1, greater than or equal to about 0.8:1, greater than or equal to about 1:1, or greater than or equal to about 1.2:1 and less than or equal to about 8:1, less than or equal to about 7.5:1, less than or equal to about 7:1, less than or equal to about 6.5:1, less than or equal to about 6:1, less than or equal to about 5.5:1, less than or equal to about 5:1, less than or equal to about 4.5:1, less than or equal to about 4:1, less than or equal to about 3.7:1, less than or equal to about 3:1, or less than or equal to about 2.5:1.

The red light emitting nanostructures included in the red pixel may have any composition. In an embodiment, at least a portion of the red light emitting nanostructures may have a (semiconductor nanocrystal) core including indium (In), phosphorus (P), and optionally, zinc (Zn) and a (semiconductor nanocrystal) shell disposed on the surface of the core and including zinc, sulfur, and optionally, selenium. The shell may be a multilayer shell in which adjacent layers have different compositions. In the red light emitting nanostructures, the core may include InP or InZnP, and the shell may include ZnS, ZnSe, ZnSeS, or a combination thereof. The shell may be at least two layered multilayer shell, and each layer may have a different composition. The shell may have a composition that varies in a radial direction for example outward from the core.

In an embodiment, the red light emitting nanostructures may have an emission peak wavelength of greater than or equal to about 620 nm, for example, greater than or equal to about 622 nm, greater than or equal to about 623 nm, greater than or equal to about 624 nm, greater than or equal to about 625 nm, greater than or equal to about 626 nm, or greater than or equal to about 627 nm, and less than or equal to about 650 nm, less than or equal to about 645 nm, less than or equal to about 640 nm, less than or equal to about 637 nm, or less than or equal to about 630 nm. The red light emitting nanostructures may exhibit a quantum yield of greater than or equal to about 80%, for example, greater than or equal to about 85%, greater than or equal to about 89%, or greater than or equal to about 90%. The shape of the red light emitting nanostructure(s) particles is not particularly limited. The shape of the red-emitting nanostructure(s) particle may include a sphere, a polyhedron, a multi-pod, or a combination thereof. The (average) size of the red light emitting nanostructure(s) may be greater than or equal to about 5 nm, for example greater than or equal to about 6 nm, and less than or equal to about 15 nm, less than or equal to about 10 nm, less than or equal to about 9 nm, or less than or equal to about 8.8 nm.

In the above display device or light emitting device, the thickness of the light emitting layer may be appropriately selected. In an embodiment, the light emitting layer may include a monolayer(s) of nanostructures. In another embodiment, the light emitting layer may include one or more monolayers of nanostructures, such as two or more, three or more, or four or more, monolayers, and 20 or less, 10 or less, 9 or less, 8 or less, 7 or less, or 6 or less, monolayers. The light emitting layer may have a thickness of greater than or equal to about 5 nm, for example, greater than or equal to about 10 nm, greater than or equal to about 20 nm, or greater than or equal to about 30 nm and less than or equal to about 200 nm, for example, less than or equal to about 150 nm, less than or equal to about 100 nm, less than or equal to about 90 nm, less than or equal to about 80 nm, less than or equal to about 70 nm, less than or equal to about 60 nm, or less than or equal to about 50 nm. The light emitting layer may have a thickness of, for example about 10 nm to about 150 nm, for example about 20 nm to about 100 nm, for example about 30 nm to about 50 nm.

The forming of the light emitting layer may be performed by preparing a composition including nanostructures (configured to emit desired light) and applying or depositing the composition on a substrate for example including an electrode or a charge auxiliary layer in an appropriate method (e.g., spin coating, inkjet printing, and the like).

The red light emitting nanostructures, the green light emitting nanostructures, and the blue light emitting nanostructures having the above structure/composition may be prepared in an appropriate method (e.g., a chemical wet method).

In an embodiment, for example, the method of preparing the nanostructures having a core/shell structure may include obtaining the core; preparing a first shell precursor solution containing a first shell precursor containing a metal (e.g., zinc) and an organic ligand; preparing a second shell precursor containing a non-metal element (e.g., sulfur, selenium, or a combination thereof); and heating the first shell precursor solution at a reaction temperature (e.g., greater than or equal to about 180° C., greater than or equal to about 200° C., greater than or equal to about 240° C., or greater than or equal to about 280° C. and less than or equal to about 360° C., less than or equal to about 340° C., or less than or equal to about 320° C.) and then, adding the core and the second shell precursor thereto to form a shell of second semiconductor nanocrystals on the first semiconductor nanocrystal core. The method may further include preparing a core solution by separating the core from a reaction system used for preparing the core and then, dispersing it in an organic solvent.

In an example embodiment, in order to form the shell, a solvent and optionally, a ligand compound are heated at a predetermined temperature (e.g., greater than or equal to about 100° C.) under vacuum (or vacuum-treated) and then, after introducing an inert gas into the reaction vessel, the reaction mixture is again heat-treated at a predetermined temperature (e.g., greater than or equal to 100° C.). Subsequently, the core is added to the reaction mixture, and the shell precursors are sequentially or simultaneously added to the reaction mixture. and then, heated at a predetermined reaction temperature. In an embodiment, the shell precursors may be added as a mixture with a different ratio of elements, for example, sequentially during the reaction time.

In the nanostructures of an embodiment, the core may be prepared by an appropriate method. The organic solvent may include a C6 to C22 primary amine such as a hexadecylamine, a C6 to C22 secondary amine such as dioctylamine, a C6 to C40 tertiary amine such as a trioctyl amine, a nitrogen-containing heterocyclic compound such as pyridine, a C6 to C40 olefin such as octadecene, a C6 to C40 aliphatic hydrocarbon such as hexadecane, octadecane, or squalane, an aromatic hydrocarbon substituted with a C6 to C30 alkyl group such as phenyldodecane, phenyltetradecane, or phenyl hexadecane, a primary, secondary, or tertiary phosphine (e.g., trioctyl phosphine) substituted with at least one (e.g., 1, 2, or 3) C6 to C22 alkyl group, a phosphine oxide (e.g. trioctylphosphine oxide) substituted with a (e.g., 1, 2, or 3) C6 to C22 alkyl group, a C12 to C22 aromatic ether such as phenyl ether or benzyl ether, or a combination thereof.

The organic ligand may coordinate the surfaces of the prepared nanostructures and allow the nanostructures to be well dispersed in the solution. The organic ligand may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', RPO$(OH)_2$, $R_2POOH$, wherein, R and R' each independently include C1 or more, C6 or more, or C10 or more and C40 or less, C35 or less, or C25 or less substituted or unsubstituted aliphatic hydrocarbon, or C6 to C40 substituted or unsubstituted aromatic hydrocarbon, or a combination thereof), or a combination thereof. The ligands may be used alone or as a mixture of two or more compounds.

After completing the reaction, a nonsolvent is added to reaction products and nanostructures coordinated with the ligand compound may be separated. The nonsolvent may be a polar solvent that is miscible with the solvent used in the core formation and/or shell formation reactions and is not capable of dispersing the prepared nanocrystals. The nonsolvent may be selected depending on the solvent used in the reaction and may include, for example, acetone, ethanol, butanol, isopropanol, ethanediol, water, tetrahydrofuran (THF), dimethylsulfoxide (DMSO), diethylether, formaldehyde, acetaldehyde, ethylene glycol, a solvent having a similar solubility parameter to the foregoing solvents, or a combination thereof. The semiconductor nanocrystal particles may be separated through centrifugation, sedimentation, or chromatography. The separated nanocrystals may be washed with a washing solvent, if needed. The washing solvent has no particular limit and may have a similar solubility parameter to that of the ligand and may, for example, include hexane, heptane, octane, chloroform, toluene, benzene, and the like.

The nanostructures may be non-dispersible or water-insoluble in water, the aforementioned nonsolvent, or a combination thereof. The nanostructures may be dispersed in the aforementioned organic solvent. In an embodiment, the nanostructures may be dispersed in a C6 to C40 aliphatic hydrocarbon, C6 to C40 substituted or unsubstituted aromatic hydrocarbon, or a combination thereof.

The electroluminescent display device may include a charge (hole or electron) auxiliary layer between the first electrode and the second electrode (e.g., an anode and a cathode). For example, the electroluminescent display device may include a hole auxiliary layer 20 or an electron auxiliary layer 40 between the anode 10 and the light emitting layer 30 and/or between the cathode 50 and the light emitting layer 30. See, FIGS. 1 and 2

The light emitting device according to an embodiment may further include a hole auxiliary layer. The hole auxiliary layer 12 is disposed between the first electrode 11 and the light emitting layer 13. The hole auxiliary layer 12 may include a hole injection layer, a hole transport layer, and/or an electron blocking layer. The hole auxiliary layer 12 may be a layer of a single component or a multilayer structure in which adjacent layers include different components.

The HOMO energy level of the hole auxiliary layer 12 may have a HOMO energy level that can be matched with the HOMO energy level of the light emitting layer 13 in order to enhance mobility of holes transferred from the hole auxiliary layer 12 to the light emitting layer 13. In an embodiment, the hole auxiliary layer 12 may include a hole injection layer close to the first electrode 11 and a hole transport layer close to the light emitting layer 13.

The material included in the hole auxiliary layer 12 (e.g., a hole transport layer, a hole injection layer, or an electron blocking layer) is not particularly limited, and may include at least one selected from, for example, poly(9,9-dioctyl-fluorene-co-N-(4)-butylphenyl)-diphenylamine) (TFB), polyarylamine, poly(N-vinylcarbazole), poly(3,4-ethylenedioxythiophene) (PEDOT), poly(3,4-ethylenedioxythiophene) polystyrene sulfonate (PEDOT:PSS), polyaniline, polypyrrole, N,N,N',N'-tetrakis(4-methoxyphenyl)-benzidine (TPD), 4,4'-bis[N-(1-naphthyl)-N-phenyl-amino]biphenyl (α-NPD), m-MTDATA (4,4',4"-Tris[phenyl(m-tolyl)amino]triphenylamine), 4,4',4"-tris(N-carbazolyl)-triphenylamine (TCTA), 1,1-bis[(di-4-toylamino)phenylcyclohexane (TAPC), a p-type metal oxide (e.g., NiO, $WO_3$, $MoO_3$, etc.), a carbon-based material such as graphene oxide, and a combinations thereof, but is not limited thereto.

In the hole auxiliary layer(s), the thickness of each layer may be appropriately selected. For example, the thickness of each layer may be greater than or equal to about 5 nm, greater than or equal to about 10 nm, greater than or equal to about 15 nm, or greater than or equal to about 20 nm and less than or equal to about 100 nm, less than or equal to about 90 nm, less than or equal to about 80 nm, less than or equal to about 70 nm, less than or equal to about 60 nm, less than or equal to about 50 nm, less than or equal to about for example, 40 nm, less than or equal to about 35 nm, or less than or equal to about 30 nm, but is not limited thereto.

The electron auxiliary layer 14 is disposed between the light emitting layer 13 and the second electrode 15. The electron auxiliary layer 14 may include, for example, an electron injection layer, an electron transport layer, and/or a hole blocking layer. The electron auxiliary layer may include, for example, an electron injection layer (EIL) that facilitates injection of electrons, an electron transport layer (ETL) that facilitates transport of electrons, a hole blocking layer (HBL) that blocks the movement of holes, or a combination thereof.

In an embodiment, the electron injection layer may be disposed between the electron transport layer and the cathode. For example, the hole blocking layer may be disposed between the light emitting layer and the electron transport (injection) layer but is not limited thereto. The thickness of each layer may be selected appropriately. For example, the thickness of each layer may be greater than or equal to about 1 nm and less than or equal to about 500 nm, but is not limited thereto. The electron injection layer may be an organic layer formed by vapor deposition. The electron transport layer may include inorganic oxide nanoparticles or may be an organic layer formed by vapor deposition.

The electron transport layer (ETL) and/or the electron injection layer, and/or the hole blocking layer may include at least one selected from, for example, 1,4,5,8-naphthalene-tetracarboxylic dianhydride (NTCDA), bathocuproine (BCP), tris[3-(3-pyridyl)-mesityl]borane (3TPYMB), LiF $Alq_3$, $Gaq_3$, $Inq_3$, $Znq_2$, $Zn(BTZ)_2$, $BeBq_2$, ET204 (8-(4-(4,6-di(naphthalen-2-yl)-1,3,5-triazin-2-yl)phenyl)quinolone), 8-hydroxyquinolinato lithium (Liq), an n-type metal oxide (e.g., ZnO, $HfO_2$, etc.) and a combination thereof, but is not limited thereto.

The electron auxiliary layer 14 may include an electron transport layer. The electron transport layer may include a plurality of nanoparticles. The plurality of nanoparticles may include a metal oxide containing zinc.

The metal oxide may include zinc oxide, zinc magnesium oxide, or a combination thereof. The metal oxide may include $Zn_{1-x}M_xO$, wherein M is Mg, Ca, Zr, W, Li, Ti, Y, Al, or a combination thereof and 0≤x≤0.5. In an embodiment, the M in the above formula may be magnesium (Mg). In an embodiment, in the above formula, the x may be greater than or equal to about 0.01 and less than or equal to about 0.3, for example, less than or equal to about 0.25, less than or equal to about 0.2, or less than or equal to about 0.15.

The absolute value of the LUMO of the aforementioned nanostructures included in the light emitting layer may be greater or smaller than the absolute value of the LUMO of the metal oxide. The average size of the nanoparticles may be greater than or equal to about 1 nm, for example, greater than or equal to about 1.5 nm, greater than or equal to about 2 nm, greater than or equal to about 2.5 nm, or greater than or equal to about 3 nm and less than or equal to about 10 nm, less than or equal to about 9 nm, less than or equal to about 8 nm, less than or equal to about 7 nm, less than or equal to about 6 nm, or less than or equal to about 5 nm.

In an embodiment, each thickness of the electron auxiliary layer 14 (e.g., electron injection layer, electron transport layer, or hole blocking layer) may be greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, greater than or equal to about 12 nm, greater than or equal to about 13 nm, greater than or equal to about 14 nm, greater than or equal to about 15 nm, greater than or equal to about 16 nm, greater than or equal to about 17 nm, greater than or equal to about 18 nm, greater than or equal to about 19 nm, or greater than or equal to about 20 nm, and less than or equal to about 120 nm, less than or equal to about 110 nm, less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, or less than or equal to about 25 nm, but is not limited thereto.

A device according to an embodiment may have a normal structure. In an embodiment, in the device, the anode 10 disposed on the transparent substrate 100 may include a metal oxide-based transparent electrode (e.g., an ITO electrode), and the cathode 50 facing the anode 10 may include a conductive metal (e.g., having a relatively low work function, Mg, Al, etc.). The hole auxiliary layer 20 (e.g., a hole injection layer such as PEDOT:PSS and/or p-type metal oxide and/or a hole transport layer such as TFB and/or PVK) may be provided between the transparent electrode 10 and the light emitting layer 30. The hole injection layer may be disposed close to the transparent electrode and the hole transport layer may be disposed close to the light emitting layer. The electron auxiliary layer 40 such as an electron injection/transport layer may be disposed between the light emitting layer 30 and the cathode 50. (Refer to FIG. 1)

A device according to another embodiment may have an inverted structure. Herein, the cathode 50 disposed on the transparent substrate 100 may include a metal oxide-based transparent electrode (e.g., ITO), and the anode 10 facing the cathode may include a metal (e.g., having a relatively high work function, Au, Ag, etc.). For example, an (optionally doped) n-type metal oxide (crystalline Zn metal oxide) or the like may be disposed as an electron auxiliary layer 40 (e.g., an electron transport layer) between the transparent electrode 50 and the light emitting layer 30. $MoO_3$ or other p-type metal oxide may be disposed as a hole auxiliary layer 20 (e.g., a hole transport layer including TFB and/or PVK and/or a hole injection layer including $MoO_3$ or other p-type metal oxide) between the metal anode 10 and the light emitting layer 30. See, FIG. 2.

The aforementioned device may be manufactured by an appropriate method. For example, the electroluminescent device may be manufactured by optionally forming a hole auxiliary layer (e.g., by deposition or coating) on a substrate on which an electrode is disposed, forming a light emitting layer including nanostructures (e.g., a pattern of the aforementioned nanostructures), and forming (optionally, an electron auxiliary layer and) an electrode (e.g., by vapor deposition or coating) on the light emitting layer. A method of forming the electrode/hole auxiliary layer/electron auxiliary layer may be appropriately selected and is not particularly limited.

In the display device of an embodiment, the blue light emitting layer may have a maximum external quantum efficiency (EQE) of greater than or equal to about 5%, greater than or equal to about 5.5%, greater than or equal to about 6%, greater than or equal to about 6.5%, greater than or equal to about 7%, greater than or equal to about 7.5%, greater than or equal to about 7.7%, greater than or equal to about 8%, greater than or equal to about 8.5%, greater than or equal to about 9%, greater than or equal to about 9.6%, greater than or equal to about 9.7%, or greater than or equal to about 10%. The blue light emitting layer may have a maximum external quantum efficiency (EQE) of less than or equal to about 100%, less than or equal to about 50%, less than or equal to about 30%, less than or equal to about 20%, or less than or equal to about 10%.

In the light emitting device or the display device, the blue light emitting layer may have a maximum brightness of greater than or equal to about 30,000 $cd/m^2$, greater than or equal to about 31,000 $cd/m^2$, greater than or equal to about 32,000 $cd/m^2$, greater than or equal to about 33,000 $cd/m^2$, greater than or equal to about 34,000 $cd/m^2$, greater than or equal to about 35,000 $cd/m^2$, greater than or equal to about 36,000 $cd/m^2$, greater than or equal to about 37,000 $cd/m^2$, greater than or equal to about 38,000 $cd/m^2$, greater than or equal to about 39,000 $cd/m^2$, greater than or equal to about 40,000 $cd/m^2$, greater than or equal to about 44,000 $cd/m^2$, greater than or equal to about 50,000 $cd/m^2$, or greater than or equal to about 52,000 $cd/m^2$. In the light emitting device or the display device, the blue light emitting layer may have a maximum brightness of less than or equal to about 1,000,000 $cd/m^2$, less than or equal to about 900,000 $cd/m^2$, less than or equal to about 800,000 $cd/m^2$, less than or equal to about 700,000 $cd/m^2$, less than or equal to about 600,000 $cd/m^2$, less than or equal to about 500,000 $cd/m^2$, less than or equal to about 400,000 $cd/m^2$, less than or equal to about 300,000 $cd/m^2$, less than or equal to about 200,000 $cd/m^2$, less than or equal to about 100,000 $cd/m^2$, less than or equal to about 90,000 $cd/m^2$, less than or equal to about 80,000 $cd/m^2$, less than or equal to about 70,000 $cd/m^2$, less than or equal to about 60,000 $cd/m^2$, or less than or equal to about 50,000 $cd/m^2$.

In the light emitting device or the display device, the blue light emitting layer may exhibit an improved life-span. In the light emitting device or the display device, the blue light emitting layer may have T90 of greater than or equal to about 1 hour, greater than or equal to about 1.5 hours, greater than or equal to about 2 hours, greater than or equal to about 2.5 hours, greater than or equal to about 3 hours, greater than or equal to about 3.5 hours, greater than or equal to about 4 hours, greater than or equal to about 4.5 hours, greater than or equal to about 5 hours, greater than or equal to about 5.5 hours, greater than or equal to about 6 hours, or greater than or equal to about 6.5 hours. In the light emitting device or the display device, the blue light emitting layer may have T90 of less than or equal to about 500 hours, less than or equal to about 300 hours, less than or equal to about 100 hours, less than or equal to about 90 hours, less than or equal to about 80 hours, less than or equal to about 70 hours, less than or equal to about 60 hours, less than or equal to about 50 hours, less than or equal to about 40 hours, or less than or equal to about 30 hours.

Specific examples are described below. However, the examples described below are only for specifically illustrating or explaining the disclosure, and the scope of the disclosure is not limited thereto.

EXAMPLES

[1] Electroluminescence Spectroscopic Analysis

A current according to an applied voltage is measured with a Keithley 2635B source meter, and a CS2000 spectrometer is used to measure electroluminescent properties (e.g., brightness) of a light-emitting device.

[2] Life-Span Characteristics

T90 (h): A device is driven at a predetermined brightness (e.g., 650 nit), and the time (hr) it takes for the brightness (e.g., luminance) to decrease to 90% of the initial brightness (100%) is determined.

T50 (h): A device is driven at a predetermined brightness (e.g., 650 nit), and the time (hr) it takes for the brightness to decrease to 50% of the initial brightness (100%) is determined.

The following synthesis is performed under an inert gas atmosphere (e.g., under nitrogen) unless otherwise specified. A precursor content is provided as a molar content, unless otherwise specified.

Synthesis Example 1

A Se/TOP stock solution and a Te/TOP stock solution are prepared by dispersing selenium (Se) and tellurium (Te) in trioctylphosphine (TOP), respectively. In a reactor containing trioctylamine, 0.125 millimole (mmol) of zinc acetate is added to the reactor with oleic acid and heated at 120° C. under vacuum. After 1 hour, nitrogen is introduced into the reactor. The reactor is heated to 300° C., and the Se/TOP stock solution and the Te/TOP stock solution in a Te:Se mole ratio of 0.03:1 or 0.05:1 are rapidly injected into the reactor. When the reaction is complete, the reaction solution is rapidly cooled to room temperature and acetone is added to the reactor. The reaction product mixture is centrifuged and the formed precipitate is separated and dispersed in toluene to obtain a ZnSeTe core.

A predetermined amount of zinc acetate and oleic acid are added to a flask containing trioctylamine and the obtained mixture is heated at 120° C. under vacuum for 10 minutes. Nitrogen ($N_2$) is then introduced into the reactor, the mixture is heated to 180° C., and the obtained ZnTeSe core is added to the reactor and a predetermined amount of Se/TOP stock solution and a predetermined amount of S/TOP stock solution (prepared by dispersing sulfer (S) in trioctylphosphine (TOP)) are added thereto. A reaction temperature is set at about 280° C. When the reaction is complete, the reactor is cooled to room temperature and the resulting nanocrystals are separated by centrifuge, washed with ethanol, and dispersed in toluene to obtain blue light emitting nanostructures (e.g., quantum dot).

The amounts of S/TOP and Se/TOP and the amount of zinc precursor are adjusted in order to obtain the quantum dots having the compositions and the sizes recited in Table 6.

Synthesis Example 2

In a 200 mL reaction flask, indium acetate and palmitic acid are dissolved in 1-octadecene and heated under vacuum at 120° C. After 1 hour, nitrogen is introduced into the reactor and the reactor is heated at 280° C., a mixed solution of tris(trimethylsilyl)phosphine (TMS3P) and trioctylphosphine is rapidly injected into the reactor and reacted for 20 minutes. Subsequently, the reaction solution is rapidly cooled to room temperature, and acetone is added to the reaction solution. The resulting precipitate is separated by centrifuge, and dispersed in toluene. TMS3P is used in an amount of 0.5 mole per 1 mole of indium. The obtained InP (semiconductor nanocrystals) core has a size of about 3 nm.

A Se/TOP stock solution is prepared by dispersing selenium in trioctylphosphine, and a S/TOP stock solution is prepared by dispersing sulfur in trioctylphosphine.

In a 200 mL reaction flask, zinc acetate and oleic acid are dissolved in trioctylamine and vacuum-treated at 120° C. for 10 minutes. Nitrogen is introduced into the reaction flask and the reaction solution is heated to 320° C. The toluene dispersion of the InP core is added to the reaction flask, and a predetermined amount of Se/TOP, and optionally, a predetermined amount of zinc acetate, is added to the flask in three or more separate injections. The reaction provides a reaction solution that contains particles having a ZnSe shell on an InP core.

Subsequently, at a reaction temperature of 320° C., the S/TOP stock solution and a predetermined amount of zinc acetate are injected into the reaction solution. A reaction is performed to obtain particles having a ZnS shell on the ZnSe shell.

An excessive amount of ethanol is added to the obtained reaction mixture and the resulting nanostructures are separated by centrifuge. After the centrifugation, the nanostructures are dried and dispersed in chloroform or toluene to obtain red light emitting nanostructures (e.g., quantum dot).

Synthesis Example 3

Blue light emitting quantum dots are synthesized according to the same method as Synthesis Example 1 except that tellurium is not used during the core synthesis.

Reference Example 1

ZnMgO Synthesis

Zinc acetate dihydrate and magnesium acetate tetrahydrate are added to dimethylsulfoxide in a reactor to provide the following chemical formula below, and the reactor is heated at 60° C. in air. Subsequently, an ethanol solution of tetramethyl ammonium hydroxide pentahydrate is added in a dropwise fashion to the reactor at a rate of 3 milliliters per minute (mL/min). The obtained mixture is stirred for one hour, and the produced $Zn_{1-x}Mg_xO$ nanoparticles are separated with a centrifuge and dispersed in ethanol to obtain $Zn_xMg_{1-x}O$ nanoparticles, where x=0.15.

Examples 1-1 and 1-2

Electroluminescent devices of Examples 1-1 and 1-2 are manufactured according to the following method by dispersing blue quantum dots (Te 0.03 for Example 1-2 and Te 0.05 for Example 1-1) according to Synthesis Example 1 in octane to prepare each quantum dot solution:

On a glass substrate deposited with an ITO electrode (anode), PEDOT:PSS and TFB layers are formed as a hole injection layer (HIL) and a hole transport layer (HTL), respectively, in a spin coating method. On the TFB layer, the quantum dot solution is spin-coated to form a light emitting layer. On the light emitting layer, a zinc magnesium oxide nanoparticle layer is formed as the electron auxiliary layer, and then, an Al electrode is deposited thereon.

A voltage (0 to 8 V, i.e., a bias voltage) is applied between the ITO electrode and the Al electrode, and EL luminous properties are measured. The results are shown in Table 1, and FIGS. 4A and 4B for the device of Example 1-1.

Comparative Example 1

An electroluminescent device is manufactured according to the same method as Example 1 except that a quantum dot solution prepared by dispersing the quantum dots according to Synthesis Example 2 in octane is used.

A voltage (0 to 8 V) is applied between the ITO electrode and the Al electrode, and EL luminous properties are measured. The results are shown in Table 2.

Comparative Example 2

An electroluminescent device is manufactured according to the same method as Example 1 except that a quantum dot solution prepared by dispersing the quantum dots of Synthesis Example 3 in octane is used.

A voltage (0 to 8 V) is applied between the ITO electrode and the Al electrode, EL luminous properties are measured. The results are shown in Table 2.

TABLE 1

|  | 3 V | 4 V | 5 V | 6 V | 7 V | 8 V | 9 V |
|---|---|---|---|---|---|---|---|
| Example 1-1 EL peak, nm | 458 | 456 | 456 | 456 | 456 | 457 | 458 |
| Example 1-1 (FWHM), nm | 36 | 29 | 26 | 26 | 26 | 26 | 26 |
| Example 1-2 EL peak, nm | 450 | 449 | 449 | 449 | 450 | 451 | 452 |
| Example 1-2 (FWHM), nm | 22 | 20 | 19 | 19 | 19 | 20 | 20 |

TABLE 2

|  | 3 V | 4 V | 5 V | 6 V | 7 V | 8 V | 9 V |
|---|---|---|---|---|---|---|---|
| Comp. Example 1 EL peak, nm | 633 | 633 | 634 | 636 | 637 | 639 | 641 |
| Comp. Example 1 (FWHM), nm | 36 | 36 | 37 | 37 | 38 | 38 | 39 |
| Comp. Example 2 EL peak, nm | 446 | 446 | 446 | 447 | 448 | 450 | 451 |
| Comp. Example 2 (FWHM), nm | 14 | 14 | 14 | 14 | 15 | 15 | 16 |

Figure 4A:
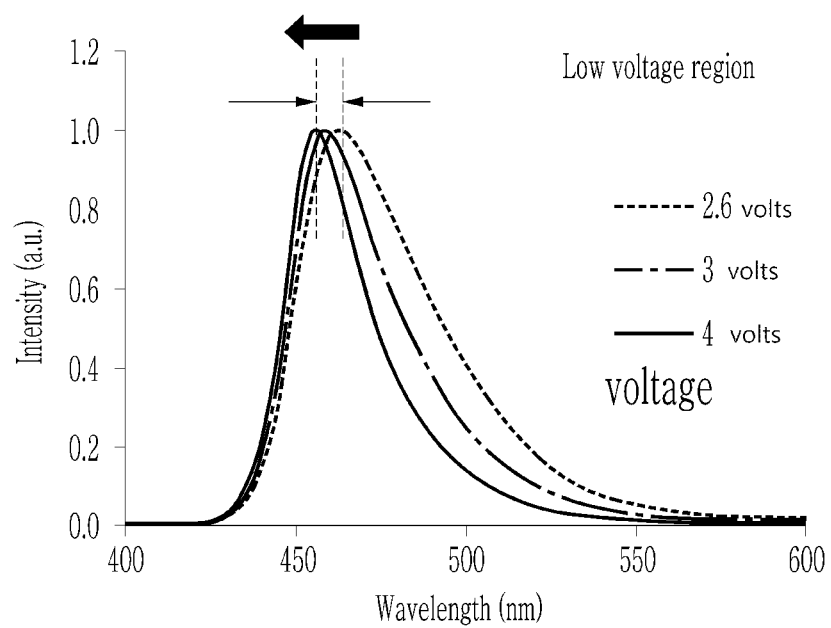
FIG. 4A shows the electroluminescence spectrum of the device of Example 1-1 (Te 0.05) at a relatively low voltage range.
Figure 4B:
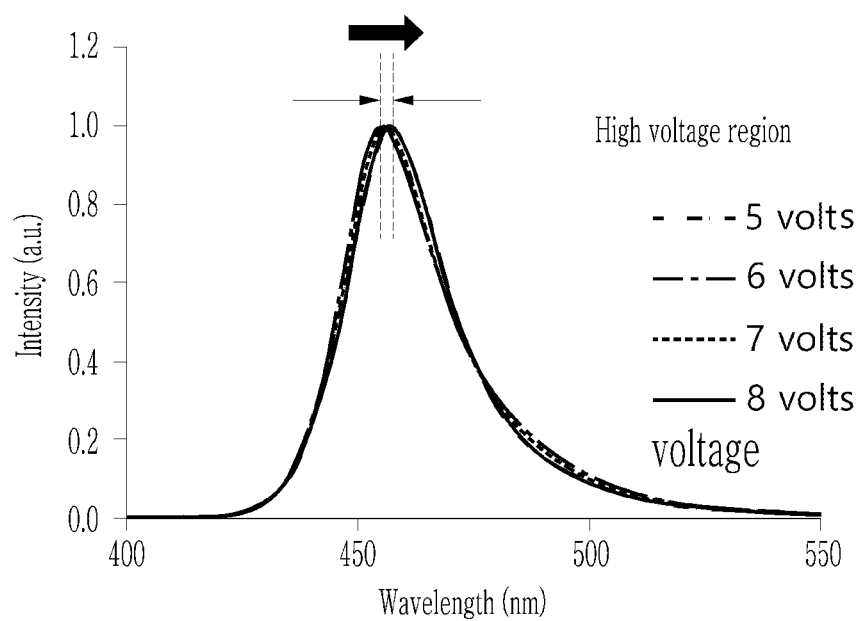
FIG. 4B shows the electroluminescence spectrum of the device of Example 1-1 (Te 0.05) at a relatively high voltage range.

Referring to the results of Table 1 and FIGS. 4A and 4B, the light emitting devices according to the examples exhibit a blue shift (e.g., at a relatively low voltage applied) or a red shift in the electroluminescence wavelength depending on the bias voltage applied thereto, and thus, if a relatively high voltage is applied to the device of the example, the change in electroluminescence wavelength can be controlled or limited within a desired range. In addition, the results confirm that the light emitting devices according to the examples may exhibit a phenomenon where a full width at half maximum (FWHM) of an electroluminescence peak decreases as the bias voltage is increased. The results of Table 2 confirm that in case of the light emitting devices according to Comparative Examples 1 and 2, as the applied bias voltage increases, an electroluminescent wavelength of the device increases without showing any blue shift and a full width at half maximum (FWHM) of an electroluminescence peak thereof is increased as well.

Figure 5A:
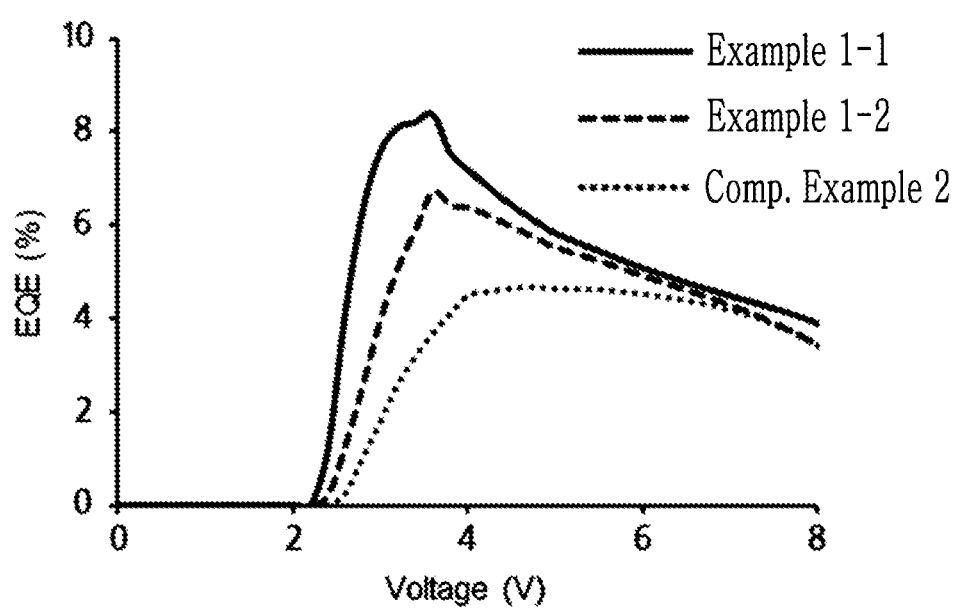
FIGS. 5A and 5B show the results of analyzing an electroluminescent property and life-span of the devices manufactured in Examples 1-1 and 1-2 and Comparative Example 2.
Figure 5B:
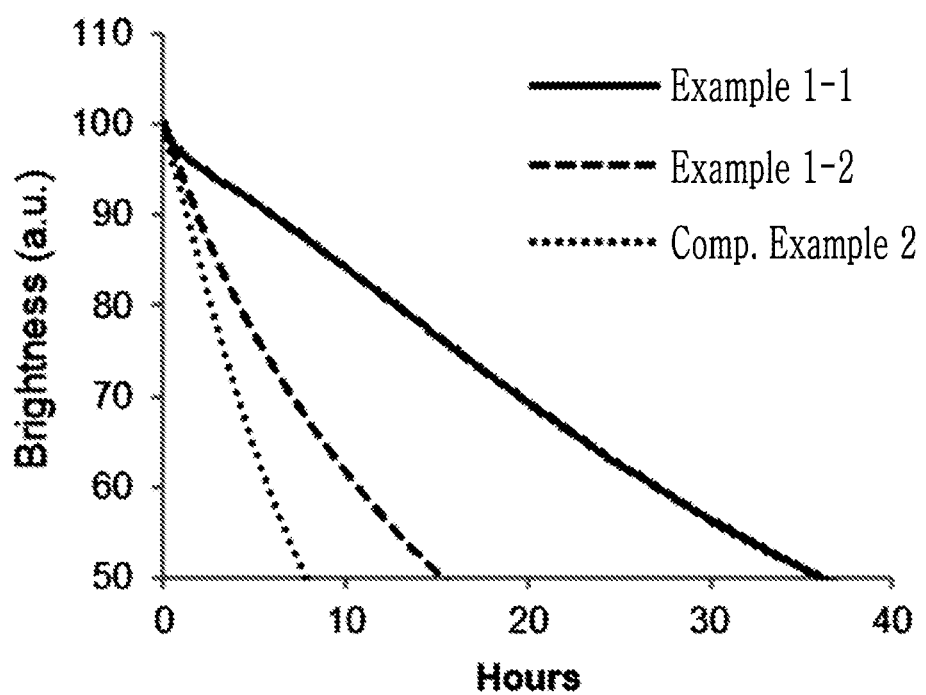

The manufactures devices are measured with respect to electroluminescent properties (maximum EQE, maximum brightness) and life-span characteristics), and the results are shown in Table 3 and FIGS. 5A and 5B.

Referring to the results, the devices of the examples exhibit improved electroluminescent properties and life-span, compared with the devices of the comparative examples.

TABLE 3

| Description | Max. EQE (%) | Max. Lum (cd/m$^2$) | T90 (hr) | T50 (hr) |
|---|---|---|---|---|
| Example 1-1 | 8.4 | 55736 | 5.9 | 36.2 |
| Example 1-2 | 6.7 | 31328 | 1.9 | 15.3 |
| Comparative Example 2 | 4.7 | 19781 | 1.3 | 7.9 |

The devices are measured with respect to brightness and currents depending on a bias voltage applied thereto, and the results are shown in Tables 4 and 5.

TABLE 4

| | Brightness (cd/m$^2$) | | |
|---|---|---|---|
| Voltage (V) | Example 1-1 | Example 1-2 | Comp. Example 2 |
| 3 | 239 | 59 | 10 |
| 4 | 8250 | 3659 | 980 |
| 5 | 21765 | 11794 | 4770 |
| 6 | 34868 | 20137 | 10242 |
| 7 | 46693 | 27583 | 16111 |
| 8 | 55293 | 31328 | 19781 |
| 9 | 51403 | 26130 | 14975 |

TABLE 5

| | Current density (mA/cm$^2$) | | |
|---|---|---|---|
| Voltage (V) | Example 1-1 | Example 1-2 | Comp. Example 2 |
| 3 | 3.5 | 2.4 | 0.8 |
| 4 | 166.1 | 131.1 | 54.9 |
| 5 | 590.6 | 526.3 | 314.1 |
| 6 | 1122.8 | 1026.9 | 732.5 |
| 7 | 1716.7 | 1588.3 | 1252.6 |
| 8 | 2328.0 | 2166.0 | 1831.8 |
| 9 | 2904.0 | 2711.5 | 2443.6 |

An inductively coupled plasma atomic emission spectroscopy (ICP-AES) analysis using Shimadzu ICPS-8100 and a Transmission electron microscopy analysis using UT F30 Tecnai electron microscope are carried out and the results are summarized in Table 6.

TABLE 6

|  | Example 1-1 | Example 1-2 | Comp. Ex 2 |
|---|---|---|---|
| Te:Se mole ratio (in the core) | 0.051:1 | 0.028:1 | 0 |
| Te:Zn mole ratio (in the core) | 0.037:1 | 0.021:1 | 0 |
| Se:Zn mole ratio (in the core) | 0.73:1 | 0.77:1 | 0.77:1 |

TABLE 6-continued

|  | Example 1-1 | Example 1-2 | Comp. Ex 2 |
| --- | --- | --- | --- |
| Te:Se mole ratio (in the nanostructure) | 0.004:1 | 0.004:1 | 0 |
| Te:Zn mole ratio (in the nanostructure) | 0.002:1 | 0.002:1 | 0 |
| Se:Zn mole ratio (in the nanostructure) | 0.47:1 | 0.51:1 | 0.52:1 |
| S:Zn mole ratio (in the nanostructure) | 0.36:1 | 0.35:1 | 0.43:1 |
| S:Se mole ratio (in the nanostructure) | 0.77:1 | 0.70:1 | 0.82:1 |
| An average size of the nanostructures (diameter TEM) | 10.5 nm | 9.9 nm | 10.5 nm |

While this disclosure has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

What is claimed is:

1. An electroluminescent display device comprising a blue pixel, wherein the electroluminescent display device comprises
a first electrode and a second electrode each having a surface opposite the other; and
a light emitting layer disposed between the first electrode and the second electrode,
wherein the light emitting layer comprises a blue light emitting layer disposed in the blue pixel and comprising a plurality of nanostructures, wherein the plurality of nanostructures does not comprise cadmium, wherein the blue light emitting layer is configured to exhibit an emission peak wavelength ($\lambda_{max}$) of greater than or equal to about 445 nanometers and less than or equal to about 480 nanometers upon application of a bias voltage between the first electrode and the second electrode,
wherein during a bias voltage change from a first voltage to a second voltage, the second voltage being greater than the first voltage by at least about 5 volts, the emission peak wavelength ($\lambda_{max}$) of the blue light emitting layer is configured to exhibit a first emission peak wavelength that is less than an emission peak wavelength at the first voltage and an emission peak wavelength at the second voltage,
wherein during the bias voltage change, a change width in the emission peak wavelength ($\lambda_{max}$) is less than or equal to about 4 nanometers.

2. The electroluminescent display device of claim 1, wherein a difference between the emission peak wavelengths at the first and second voltages is less than about 4 nm.

3. The electroluminescent display device of claim 1, further comprising a charge auxiliary layer including a hole auxiliary layer comprising an organic compound, and/or an electron auxiliary layer comprising metal oxide nanoparticles.

4. The electroluminescent display device of claim 1, wherein
the plurality of nanostructures comprises a first semiconductor nanocrystal comprising zinc, selenium, and tellurium and a second semiconductor nanocrystal comprising a zinc chalcogenide containing zinc, selenium, and sulfur and different from the first semiconductor nanocrystal, and
in the plurality of nanostructures,
a mole ratio of tellurium to selenium is less than or equal to about 0.05:1 and greater than or equal to about 0.0021:1, and
a mole ratio of sulfur to selenium is greater than or equal to about 0.1:1 and less than or equal to about 1:1.

5. The electroluminescent display device of claim 1, wherein
the plurality of nanostructures comprises a first semiconductor nanocrystal comprising zinc, selenium, and tellurium and a second semiconductor nanocrystal comprising a zinc chalcogenide containing zinc, selenium, and sulfur and different from the first semiconductor nanocrystal, and
in the plurality of nanostructures,
a mole ratio of tellurium to selenium is less than or equal to about 0.05:1 and greater than or equal to about 0.001:1, and
a mole ratio of sulfur to zinc is greater than or equal to about 0.23:1 and less than or equal to about 0.40:1.

6. The electroluminescent display device of claim 1, wherein the blue light emitting layer has a minimum value of the first emission peak wavelength ($1^{st} \lambda_{max}$) at voltage A, wherein voltage A is greater than the first voltage and less than or equal to the second voltage.

7. The electroluminescent display device of claim 1, wherein in the blue light emitting layer, a difference between the emission peak wavelength at the first voltage and the emission peak wavelength at the second voltage is less than or equal to about 3 nanometers.

8. The electroluminescent display device of claim 1, wherein a full width at half maximum of an emission peak at the second voltage is less than a full width at half maximum of an emission peak at the first voltage.

9. The electroluminescent display device of claim 8, wherein a difference between the full width at half maximum of the emission peak at the second voltage and the full width at half maximum of the emission peak at the first voltage is greater than or equal to about 1 nanometer.

10. The electroluminescent display device of claim 1, wherein the change width in the emission peak wavelength ($\lambda_{max}$) is greater than or equal to about 1 nanometer.

11. The electroluminescent display device of claim 1, wherein the display device further comprises a red pixel, a green pixel, or a red pixel and a green pixel, wherein the light emitting layer comprises a red light emitting layer disposed in the red pixel and comprising a plurality of red light emitting nanostructures, and/or a green light emitting layer disposed in the green pixel and comprising a plurality of green light emitting nanostructures.

12. A light emitting device, comprising
an anode and a cathode each having a surface opposite the other; and a blue light emitting layer disposed between the anode and the cathode and comprising a plurality of nanostructures, and
wherein the blue light emitting layer is configured to exhibit an emission peak wavelength of greater than or equal to about 445 nanometers and less than or equal to about 480 nanometers upon application of a bias voltage between the first electrode and the second electrode,
wherein during a bias voltage change from a first voltage to a second voltage, the second voltage being greater than the first voltage by at least about 5 volts, the emission peak wavelength ($\lambda_{max}$) of the blue light emitting layer is configured to exhibit a first emission peak wavelength that is less than an emission peak wavelength at the first voltage an emission peak wavelength at the second voltage, wherein during the bias voltage change, a change width in the emission peak wavelength ($\lambda_{max}$) is less than or equal to about 4 nm.

13. The light emitting device of claim 12, wherein a difference between the emission peak wavelengths at the first and second voltages is less than about 4 nm.

14. The light emitting device of claim 12, further comprising an auxiliary layer including a hole transport layer comprising an organic polymer compound and the electron auxiliary layer comprises zinc magnesium metal oxide nanoparticles.

15. The light emitting device of claim 12, wherein the plurality of nanostructures comprises a core comprising a first semiconductor nanocrystal comprising zinc, selenium, and tellurium and a semiconductor nanocrystal shell disposed on the core and comprising a zinc chalcogenide having a composition different from that of the first semiconductor nanocrystal, and in the plurality of nanostructures, a mole ratio of tellurium to selenium is less than or equal to about 0.05:1 and greater than or equal to about 0.0021:1, and a mole ratio of sulfur to selenium is greater than or equal to about 0.1:1 and less than or equal to about 1:1.

16. The light emitting device of claim 12, wherein in the blue emitting layer, a difference between the emission peak wavelength at the first voltage and the emission peak wavelength at the second voltage is less than or equal to about 3 nanometers.

17. The light emitting device of claim 12, wherein a full width at half maximum of an emission peak at the second voltage is less than a full width at half maximum of an emission peak at the first voltage.

18. The light emitting device of claim 12, wherein a difference between a full width at half maximum of an emission peak at the second voltage and a full width at half maximum of an emission peak at the first voltage is greater than or equal to about 1 nanometer, or wherein a change width in the emission peak wavelength is greater than or equal to about 1 nanometer.

19. The light emitting device of claim 12, wherein the light emitting device has T90 of greater than or equal to about 1 hour.

20. The light emitting device of claim 12, wherein the light emitting device has a maximum brightness of greater than or equal to about 30,000 candela per square meter.

* * * * *